(12) United States Patent
Nakatsuka et al.

(10) Patent No.: US 7,477,115 B2
(45) Date of Patent: *Jan. 13, 2009

(54) PIEZOELECTRIC RESONATOR, METHOD OF MANUFACTURING PIEZOELECTRIC RESONATOR, AND FILTER, DUPLEXER, AND COMMUNICATION DEVICE USING PIEZOELECTRIC RESONATOR

(75) Inventors: Hiroshi Nakatsuka, Osaka (JP); Keiji Onishi, Osaka (JP); Hiroyuki Nakamura, Osaka (JP); Takehiko Yamakawa, Osaka (JP); Hiroshi Yamaguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 261 days.

This patent is subject to a terminal disclaimer.

(21) Appl. No.: 11/488,148

(22) Filed: Jul. 18, 2006

(65) Prior Publication Data
US 2007/0001781 A1 Jan. 4, 2007

Related U.S. Application Data

(63) Continuation-in-part of application No. 10/979,420, filed on Nov. 3, 2004, now Pat. No. 7,113,055.

(30) Foreign Application Priority Data
Nov. 7, 2003 (JP) .............................. 2003-378260

(51) Int. Cl.
*H03H 9/72* (2006.01)
*H03H 9/64* (2006.01)
*H03H 9/15* (2006.01)

(52) U.S. Cl. ..................... 333/133; 333/189; 310/324

(58) Field of Classification Search ................. 333/187, 333/189, 133
See application file for complete search history.

(56) References Cited

U.S. PATENT DOCUMENTS 6,349,454 B1   2/2002   Manfra et al.

(Continued)

FOREIGN PATENT DOCUMENTS

JP         60-68710         4/1985

(Continued)

OTHER PUBLICATIONS

Hiroyuki Nakamura et al., U.S. Appl. No. 10/979,276, filed Nov. 3, 2004.

(Continued)

*Primary Examiner*—Barbara Summons
(74) *Attorney, Agent, or Firm*—Wenderoth, Lind and Ponack, L.L.P.

(57) ABSTRACT

A piezoeletric resonator includes: a substrate; a lower electrode formed on or above the substrate; a piezoeletric body formed on or above the lower electrode; an upper electrode formed on or above the piezoeletric body; and a cavity under a vibrating portion formed by the lower electrode, the piezoeletric body, and the upper electrode. Where a resonant frequency of vibration with a thickness of the vibrating portion being a half of a wavelength is taken as fr, an average of ultrasonic velocity in a material forming the cavity is taken as Vc, and a value determined based on the resonant frequency fr and the average of ultrasonic velocity Vc is taken as λc (=Vc/fr), a depth of the cavity is set so as to be equal to or larger than n×λc/2−λc/8 and equal to or smaller than n×λc/2+λc/8.

7 Claims, 24 Drawing Sheets

U.S. PATENT DOCUMENTS

| | | |
|---|---|---|
| 6,355,498 B1 | 3/2002 | Chan et al. |
| 6,377,137 B1 | 4/2002 | Ruby |
| 6,842,088 B2 | 1/2005 | Yamada et al. |
| 7,113,055 B2 * | 9/2006 | Nakatsuka et al. .......... 333/133 |
| 2003/0088960 A1 | 5/2003 | Seo et al. |
| 2005/0099092 A1 | 5/2005 | Nakamura et al. |
| 2005/0099093 A1 | 5/2005 | Yamaguchi et al. |

FOREIGN PATENT DOCUMENTS

| | | |
|---|---|---|
| JP | 60-68711 | 4/1985 |
| JP | 2002-198758 | 7/2002 |
| JP | 2003-32060 | 1/2003 |

OTHER PUBLICATIONS

Hiroshi Yamaguchi et al., U.S. Appl. No. 10/979,277, filed Nov. 3, 2004.

Office Action from U.S.PTO in Yamaguchi et al., U.S. Appl. No. 10/979,277., dated Sep. 17, 2006.

* cited by examiner

PIEZOELECTRIC RESONATOR, METHOD OF MANUFACTURING PIEZOELECTRIC RESONATOR, AND FILTER, DUPLEXER, AND COMMUNICATION DEVICE USING PIEZOELECTRIC RESONATOR

This is a Continuation-In-Part Application of U.S. patent application Ser. No. 10/979,420, filed Nov. 3, 2004, now U.S. Pat. No. 7,113,055.

BACKGROUND OF THE INVENTION

1. Field of the Invention

The present invention relates to a piezoelectric resonator, a method of manufacturing such a piezoelectric resonator, and a filter, a duplexer, and a communication device using such a piezoelectric resonator. More specifically, the present invention relates to a piezoelectric resonator improved so as to be able to remove spurious components, a method of manufacturing such a piezoelectric resonator, and a filter, a duplexer, and a communication device using such a piezoelectric resonator.

2. Description of the Background Art

Components incorporated in electronic devices such as cellular phones are required to be small in size and weight. For example, a filter for use in a cellular phone is required to be small in size and be precisely adjusted in frequency characteristic.

One of known filters satisfying such requirements is a filter using a piezoelectric resonator (for example, refer to Japanese Patent Laid-Open Publication No. 60-68711, pp. 2-4, FIGS. 3 and 4).

FIG. 14A is a section view of a basic structure of a conventional piezoelectric resonator. In FIG. 14A, a piezoelectric resonator 710 is provided on a substrate 705. On the substrate 705, a cavity 704 is formed by partially etching from the underside of the substrate 705 through a fine processing scheme. The piezoelectric resonator 710 includes a piezoelectric body 701, which is a main component of the resonator, and an upper electrode 702 and a lower electrode 703 that are provided above and below, respectively, the piezoelectric body 701.

The hollow cavity 704 is provided in the substrate 705 in order to ensure vibrations of the piezoeletric resonator 710.

The piezoelectric resonator 710 is applied with an electric field in a thickness direction via the upper electrode 702 and the lower electrode 703 that are provided above and below, respectively, the piezoelectric body 701. With this, the piezoeletric resonator 710 vibrates in the thickness direction.

The operation of the piezoelectric resonator 710 is described below by using vertical vibrations in the thickness direction on an infinite plane. FIG. 14B is a schematic perspective view for describing the operation of the piezoeletric resonator 710. As shown in FIG. 14B, when an electric field is applied to the upper electrode 702 and the lower electrode 703, electric energy is transformed to mechanical energy at the piezoeletric body 701. The excited mechanical vibrations are vibrations expanding in the thickness direction, and therefore the piezoelectric body 701 expands in a direction of the electric field.

When the thickness of the piezoeletric resonator 710 is t, the piezoelectric resonator 710 uses resonant vibrations in the thickness of the piezoelectric body 701 to produce resonance at a resonant frequency of fr1 (=v/λ) corresponding to a wavelength λ satisfying t=λ/2. Here, v is an average of ultrasonic velocity in the material forming the piezoelectric resonator 710.

In the structure of the piezoeletric resonator 710 shown in FIG. 14, with the cavity 704 being formed, vertical vibrations in the thickness direction of the piezoeletric body 701 are ensured.

FIG. 14C is a diagram of an equivalent circuit of the piezoeletric resonator 710. As shown in FIG. 14C, the equivalent circuit of the piezoelectric resonator 710 includes a serial resonant circuit and a parallel resonant circuit. That is, the equivalent circuit includes a serial resonant circuit formed of a capacitor (C1), an inductor (L1), and a resistor (R1), and a parallel resonant circuit formed of a capacitor (C0) connected in parallel to the serial resonant circuit. Therefore, the piezoeletric resonator 710 has a resonant frequency and an anti-resonant frequency. FIG. 14D is a graph showing a frequency characteristic of admittance in the equivalent circuit shown in FIG. 14C. As shown in FIG. 14D, admittance is maximum at a resonant frequency of fr1 and minimum at an anti-resonant frequency of fa1. Here, fr1 and fa1 have the following relation.

$$fr1 = \frac{1}{2\pi\sqrt{L1 \cdot C1}}$$

$$fa1 = fr\sqrt{1 + \frac{C1}{C0}}$$

When the piezoelectric resonator 710 is applied to a filter by using the frequency characteristic of the admittance, a small-sized filter with low loss using resonant vibration of the piezoelectric body can be achieved.

In practice, since the piezoelectric resonator is partially fixed to the substrate, the entire piezoelectric resonator does not make free vertical vibrations. The vibrating portion is divided, as shown in FIG. 14A, into a vibrating region fixed to a peripheral portion of the cavity 704 and a vibrating region with its both ends vibrating as free ends, such as an upper portion of the cavity.

In the vibrating portion, vibration defined by the thickness of the vibrating portion is exited as main resonant vibration. The vibrating portion is fixed to the periphery of the cavity, and the fixed portion is actually not completely fixed as fixed end. Therefore, the main resonant vibration having a frequency of f1 is propagated to the substrate via the fixed portion. As a result, depending on how the vibrating portion is supported and fixed, in addition of desired vertical vibration in the thickness direction in a fundamental mode (hereinafter referred to as a ½ wavelength mode with its frequency of f1), spurious vibration having a frequency near the frequency f1 of the main resonant frequency occurs.

The reason for occurrence of such spurious vibration is that spurious vibration is excited by a leak of vibration of the fixed portion to the substrate. Here, it is assumed that a resonant frequency of the spurious vibration is near the main resonant frequency of the main resonant vibration. With the main resonant vibration leaked to the substrate, spurious vibration occurs. Since it is assumed that the resonant frequency of the spurious vibration is near the main resonant frequency, the spurious vibration causes a spurious resonant frequency to occur near the main resonant frequency. FIG. 15A is a graph showing a frequency characteristic of admittance when spurious vibration is present. As shown in FIG. 15A, spurious vibration, that is, a spurious resonant frequency 713, is present between the resonant frequency fr1 and the anti-resonant frequency fa1.

FIG. 15B is a circuit diagram showing the structure of a filter using a piezoelectric resonator. FIG. 15C is a diagram showing a frequency passing characteristic when the piezoelectric resonator with the spurious resonant frequency 713 is used for the filter as shown in FIG. 15B.

As shown in FIG. 15B, when piezoelectric resonators having the spurious resonant frequency 713 are connected to each other in parallel and to another resonator in series to form a filter, a frequency passing characteristic (skirt characteristic) having two abrupt attenuation poles can be achieved. However, due to the spurious resonant frequency 713, unevenness 714 occurs in a pass-band. If such a filter having the unevenness 714 is used, a signal passing the evenness 714 becomes at a signal larger or smaller than a designed level. As a result, quality degradation in communications occurs.

In general, what is important for the filter is that no spurious resonant frequency is present in a desired band. Therefore, it is required for the serial resonator and the parallel resonator forming a filter not to generate a spurious resonant frequency in the desired band.

SUMMARY OF THE INVENTION

Therefore, an object of the present invention is to provide a piezoelectric resonator improved so as to be able to suppress a spurious resonant frequency in a predetermined band, a method of manufacturing such a piezoelectric resonator, and a filter, a duplexer, and a communication device using such a filter.

To solve the problem mentioned above, the present invention has the following features. The present invention is directed to a piezoeletric resonator including: a substrate; a lower electrode formed on or above the substrate; a piezoeletric body formed on or above the lower electrode; an upper electrode formed on or above the piezoeletric body; and a cavity under a vibrating portion formed by the lower electrode, the piezoelectric body, and the upper electrode, and the cavity has a trapezoidal shape in section, wherein where a resonant frequency of vibration with a thickness of the vibrating portion being a half of a wavelength is taken as fr, an average of ultrasonic velocity in a material forming the cavity is taken as Vc, and a value determined based on the resonant frequency fr and the average of ultrasonic velocity Vc is taken as $\lambda c$ ($=Vc/fr$), a depth of the cavity is set so as to be equal to or larger than $n \times \lambda c/2 - \lambda c/8$ and equal to or smaller than $n \times \lambda c/2 + \lambda c/8$.

Preferably, the depth of the cavity is set as $n \times \lambda c/2$.

For example, when the piezoelectric resonator is used to form a band-pass filter, the depth of the cavity is preferably determined so that no spurious resonant frequency is present within a frequency range of a half of a desired pass-bandwidth of the band-pass filter.

For example, when the band-pass filter is used for Personal Communications Services (PCS), the depth of the cavity is preferably set so as to be equal to or larger than $n \times \lambda c/2 - \lambda c/10$ and equal to or smaller than $n \times \lambda c/2 + \lambda c/10$.

The present invention is also directed to a filter including a plurality of piezoelectric resonators, wherein at least one of the piezoeletric resonators includes: a substrate; a lower electrode formed on or above the substrate; a piezoelectric body formed on or above the lower electrode; an upper electrode formed on or above the piezoeletric body; and a cavity under a vibrating portion formed by the lower electrode, the piezoeletric body, and the upper electrode, and the cavity has a trapezoidal shape in section, and where a resonant frequency of vibration with a thickness of the vibrating portion being a half of a wavelength is taken as fr, an average of ultrasonic velocity in a material forming the cavity is taken as Vc, and a value determined based on the resonant frequency fr and the average of ultrasonic velocity Vc is taken as $\lambda c$ ($=Vc/fr$), a depth of the cavity is set so as to be equal to or larger than $n \times \lambda c/2 - \lambda c/8$ and equal to or smaller than $n \times \lambda c/2 + \lambda c/8$, where n is an integer.

Also, the present invention is also directed to a duplexer formed by a filter including a plurality of piezoeletric resonators, wherein at least one of the piezoeletric resonators has the above-described features.

The present invention is further directed to a communication device including a piezoeletric resonator, wherein the piezoeletric resonator includes the above-described features.

According to the present invention, a spurious resonant frequency can be removed from a resonant frequency and an anti-resonant frequency. Also, such a spurious resonant frequency can be separated from the resonant frequency. Thus, spurious resonance can be suppressed in a predetermined band. Therefore, when the piezoeletric resonator is used for a filter, spurious resonance can be moved outside of the pass-band, thereby achieving a flat band-pass characteristic.

Particularly, with the depth of the cavity being $n \times \lambda c/2$, the spurious resonant frequency can be separated most from the resonant frequency.

Also, when the piezoelectric resonator is used to form a band-pass filter, the depth of the cavity is determined so that no spurious resonant frequency is present within a frequency range of a half of a desired pass-bandwidth of the band-pass filter. With this, the band-pass filter has a flat band-pass characteristic.

Particularly, when the band-pass filter is used for Personal Communications Services (PCS), the depth of the cavity is set so as to be equal to or larger than $n \times \lambda c/2 - \lambda c/10$ and equal to or smaller than $n \times \lambda c/2 + \lambda c/10$. With this, a flat band-pass characteristic can be achieved in the PCM pass-band.

These and other objects, features, aspects and advantages of the present invention will become more apparent from the following detailed description of the present invention when taken in conjunction with the accompanying drawings.

DESCRIPTION OF THE PREFERRED EMBODIMENTS

With reference to the drawings, embodiments of the present invention are described below.

First Embodiment

Figure 1:
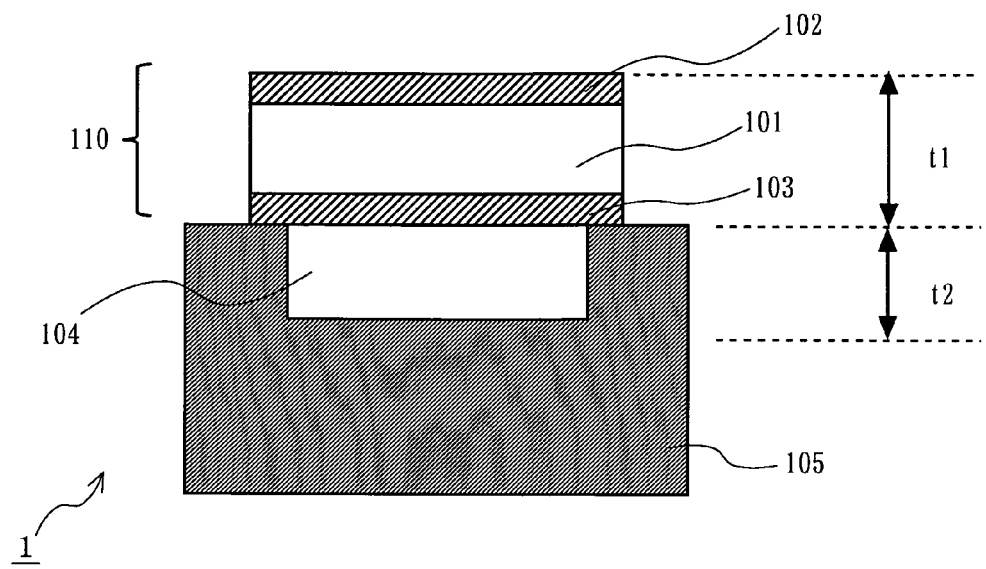
FIG. 1 is a section view of a piezoelectric resonator 1 according to a first embodiment of the present invention.

FIG. 1 is a section view of a piezoelectric resonator 1 according to a first embodiment of the present invention. In FIG. 1, the piezoelectric resonator 1 includes a piezoelectric body 101, an upper electrode 102, a lower electrode 103, a cavity 104, and a substrate 105.

The lower electrode 103 is formed on the substrate 105 with, for example, molybdenum (Mo), tungsten (W), aluminum (Al), titanium (Ti), copper (Cu), platinum (Pt), or gold (Au).

The piezoelectric body 101 is formed on the lower electrode with an appropriate piezoelectric material, such as zinc oxide (ZnO), lead zirconate titanate (PZT), or aluminum nitride (AlN).

The upper electrode 102 is formed on the piezoelectric body 101 with, for example, molybdenum (Mo), tungsten (W), aluminum (Al), titanium (Ti), copper (Cu), platinum (Pt), or gold (Au).

Figure 16A:
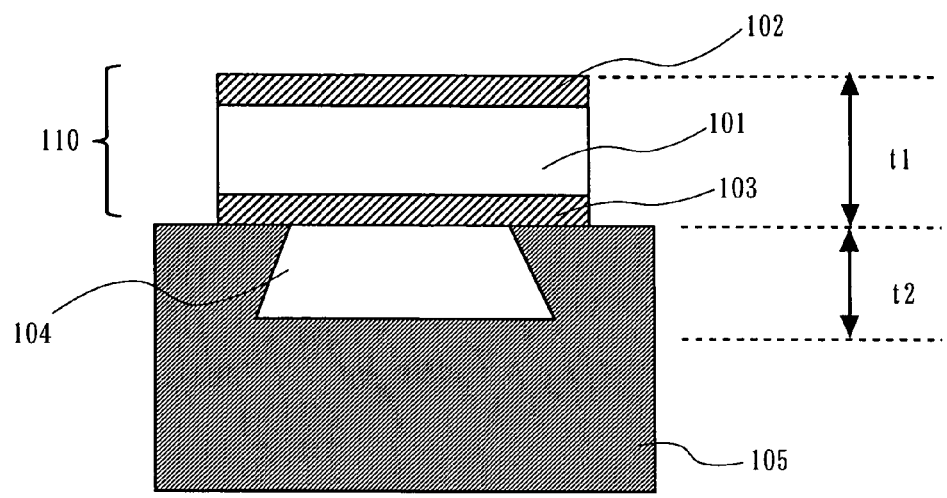
FIGS. 16A and 16B are section views of other piezoelectric resonators of the present invention.
Figure 16B:
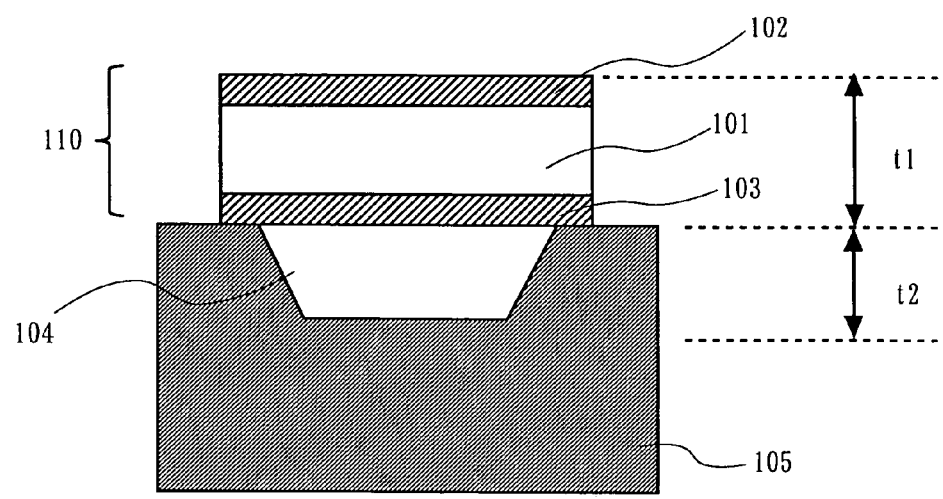
Figure 17A:
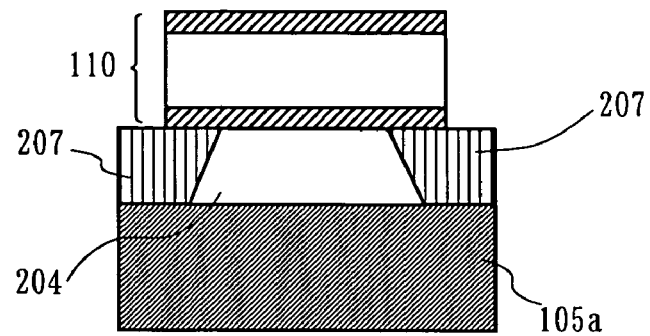
FIGS. 17A, 17B, 17C, 17D, and 17E are section views of other piezoelectric resonators of the present invention.
Figure 17B:
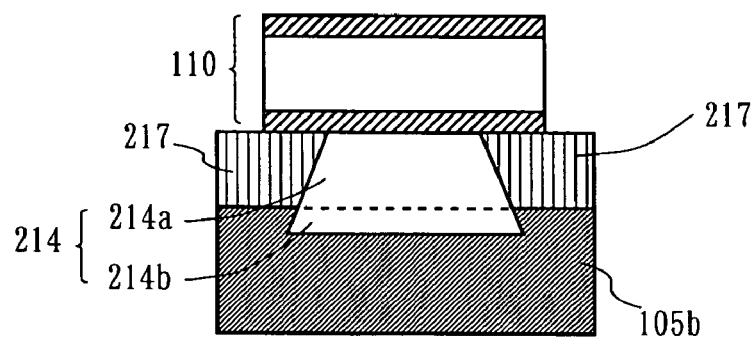
Figure 17C:
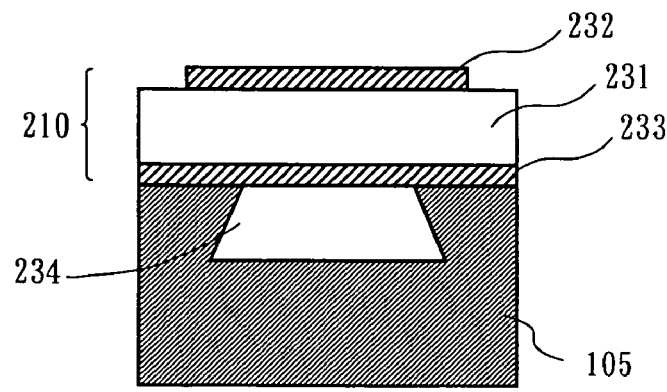
Figure 17D:
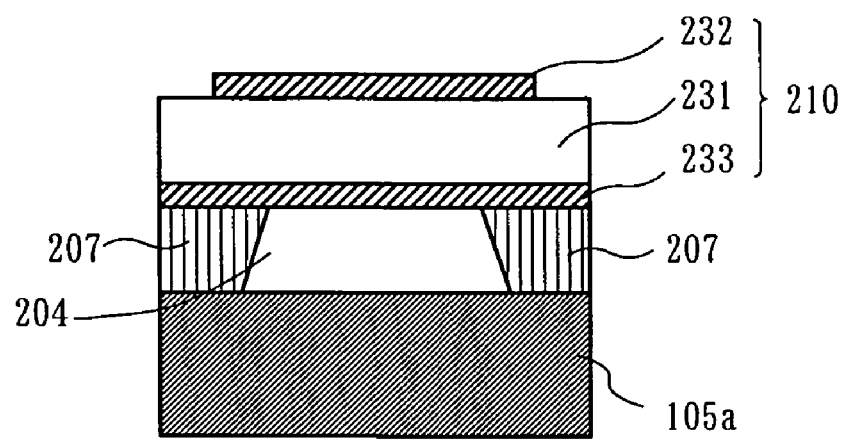
Figure 17E:
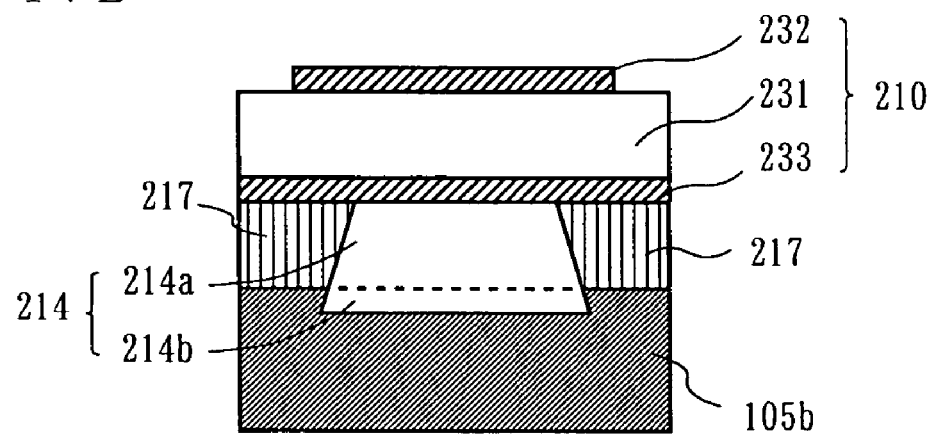
Figure 18A:
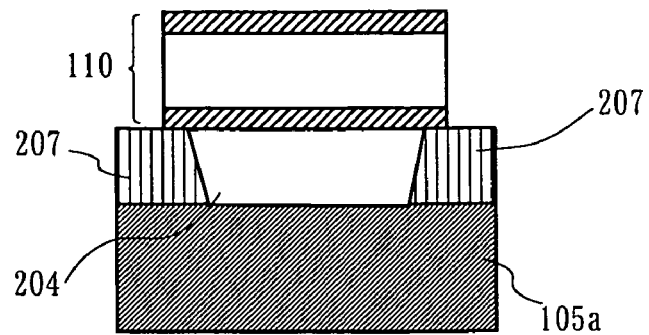
FIGS. 18A, 18B, 18C, 18D, and 18E are section views of other piezoelectric resonators of the present invention.
Figure 18B:
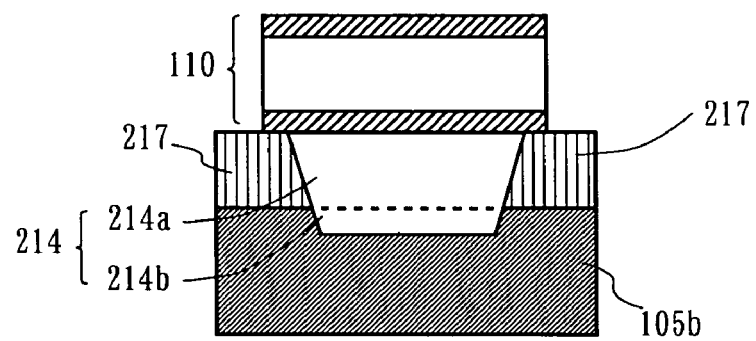
Figure 18C:
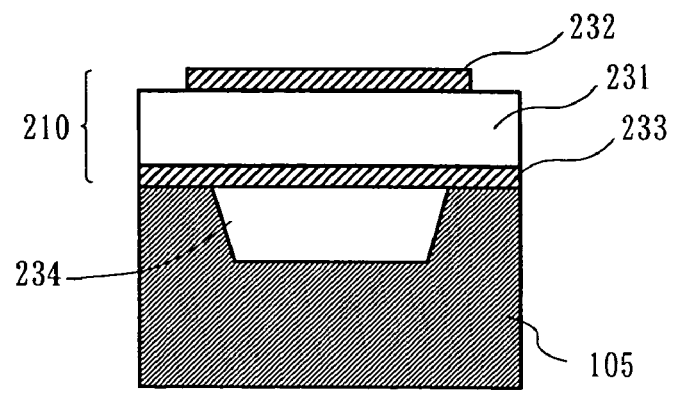
Figure 18D:
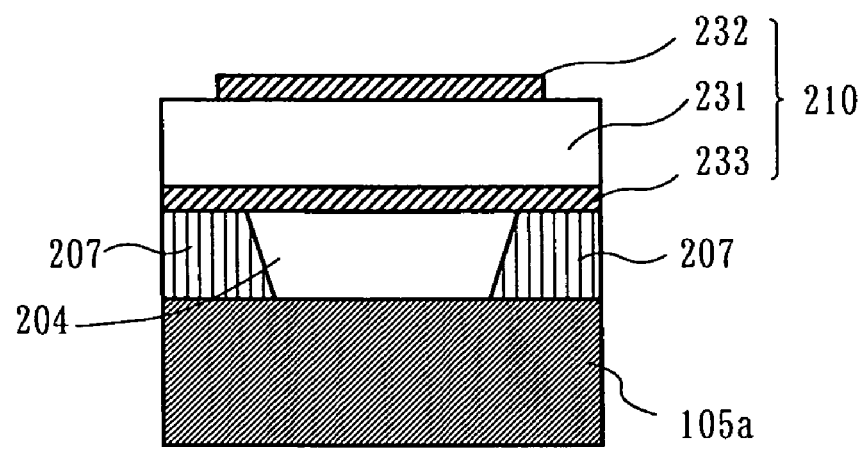
Figure 18E:
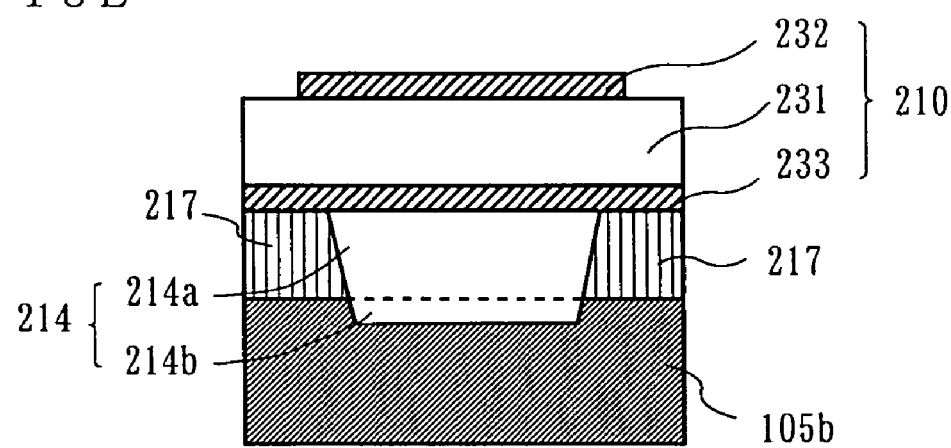

The cavity 104 is formed on an upper portion of the substrate 105 below the lower electrode 103. The cavity 104 has a rectangular or trapezoidal shape, for example, in cross section. FIG. 1 shows that the cavity 104 has a rectangular shape in cross section. FIGS. 16A and 16B show that the cavity 104 has a trapezoidal shape in cross section. The trapezoidal shape represents a shape in which at least one wall of the cavity 104 is inclined relative to a vertical axis representing a depth direction.

Here, a resonant frequency defined by a thickness t1 of the vibrating portion 110 formed by the upper electrode 102, the piezoelectric body 101, and the lower electrode 103 is denoted as fr. Also, a resonant frequency defined by a depth t2 of the cavity 104 is denoted as frc. In the first embodiment, the resonant frequency fr and the resonant frequency frc are set so as to be different from each other. Here, an average of ultrasonic velocity in the vibrating portion 110 is denoted as Vs. With the upper and lower ends of the vibrating portion 110 being fixed, the resonant frequency fr is fr=Vs/(2×t1). Also, an average of ultrasonic velocity in the material forming the cavity 104 is denoted as Vc. With the lower end of the cavity 104 being a free end, the resonant frequency frc is frc=(2n−1)×Vc/(4×t2). Here, n is an arbitrary integer equal to or larger than 1.

The vibration of the vibrating portion 110 is leaked to the substrate 105 via a connecting portion between the vibrating portion 110 and the substrate 105. A vibration leaked to the substrate 105 has various frequencies. Therefore, the leaked vibration may cause the substrate 105 and/or the cavity 104 to resonate at various frequencies. A reason for the occurrence of such a resonant phenomenon at the substrate 105 and/or the cavity 104 is that the cavity 104 becomes a resonant tube. Therefore, resonance at the substrate 105 and/or the cavity 104 depends mainly on the shape of the cavity 104. Therefore, the resonant frequency of resonance at the substrate 105 and/or the cavity 104 is near the resonant frequency defined by the depth of the cavity 104. When resonance near the resonant frequency defined by the depth of the cavity 104 is excited near the resonant frequency of the vibrating portion 110, a spurious resonant frequency occurs. Therefore, according to the present embodiment, the resonant frequency defined by the thickness t1 of the vibrating portion 110 is made different from the resonant frequency defined by the thickness t2 of the cavity 104. With this, resonance occurring due to leaked vibration is prevented from being exited near the resonant frequency of the vibrating portion 110. Thus, it is evident that a spurious resonant frequency does not occur near the resonant frequency fr.

The inventors found through simulations that the resonant frequency defined by the thickness t1 of the vibrating portion 110 is made different from the resonant frequency defined by the depth t2 of the cavity 104, thereby preventing resonance occurring due to leaked vibration from being excited near the resonant frequency of the vibrating portion 110.

Figure 2:
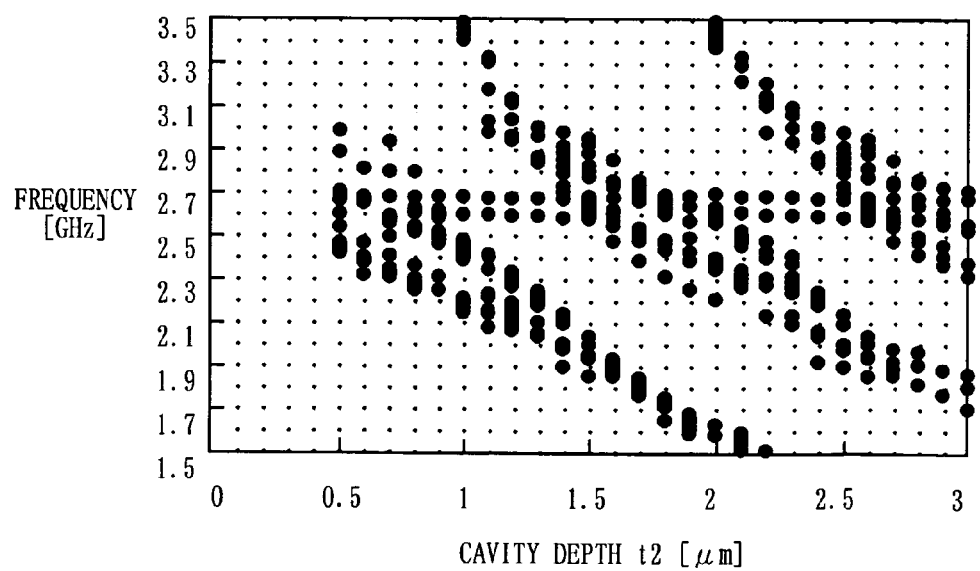
FIG. 2 is a graph showing simulation results regarding a relation between a depth t2 of a cavity 104 and a resonant frequency of resonance excited at the piezoelectric resonator 1 shown in FIG. 1.

FIG. 2 is a graph showing simulation results regarding a relation between the depth t2 of the cavity 104 and the resonant frequency of vibration exited at the piezoelectric resonator 1 shown in FIG. 1. In FIG. 2, the horizontal axis represents the depth of the cavity 104. The vertical axis represents the frequency [GHz]. In FIG. 2, each resonant frequency excited at the piezoelectric resonator 1 is plotted with respect to the depth t2 of the cavity 104.

As shown FIG. 2, there are constant resonant frequencies approximately near a range of approximately 2.6 GHz to approximately 2.7 GHz. These resonant frequencies are resonant frequencies (hereinafter, main resonant frequencies) of resonance (hereinafter, main resonance) defined by the thickness t1 of the vibrating portion 110.

FIG. 2 also shows resonant frequencies varied with the depth of the cavity 104. For example, resonant frequencies varied in a range of approximately 3.0 GHz to approximately 1.5 GHz are plotted with respect to depths of the cavity 104 varied from 0.5 [μm] to 2.3 [μm]. Also resonant frequencies varied in a range of approximately 3.5 GHz to approximately 1.7 GHz are plotted with respect to depths of the cavity 104 varied from 1 [μm] to 3 [μm]. Further resonant frequencies varied from approximately 3.5 GHz to approximately 2.3 GHz are plotted with respect to depths of the cavity 104 varied from 2 [μm] to 3 [μm]. Resonances of these resonant frequencies mentioned above simultaneously occur for the same depth of the cavity 104. Thus, a plurality of resonant frequencies is plotted for a depth of the cavity 104.

As such, in the piezoelectric resonator 1, a plurality of resonances other than the main resonance occur (spurious resonance). As shown in FIG. 2, spurious resonance is varied depending on the depth of the cavity 104. Therefore, a resonant frequency of spurious resonance (a spurious resonant frequency) is present near a resonant frequency defined by the depth of the cavity (hereinafter, a cavity resonant frequency).

When the cavity resonant frequency defined by the depth of the cavity 104 approximately coincides with the main resonant frequency defined by the thickness of the vibrating portion 110, the spurious resonant frequency is present near the main resonant frequency. Therefore, much spurious resonance occurs near the main resonance.

On the other hand, with the main resonant frequency and the cavity resonant frequency being varied, no spurious resonant frequency is present near the main resonant frequency. Therefore, spurious resonance does not occur near the main resonance. As a result, it is possible to provide a piezoelectric resonator having a characteristic represented by an admittance curve without a spurious resonant frequency between the resonant frequency fr and the anti-resonant frequency fa. When such a resonator is used for forming a filter, a smooth band-pass characteristic curve can be achieved.

As such, according to the first embodiment, the resonant frequency defined by the thickness of the vibrating portion 110 is set to be different from the resonant frequency defined by the depth of the cavity 104. Therefore, it is possible to prevent a spurious resonant frequency in the main resonant frequency caused by vibration of the vibrating portion 110 leaked to the substrate 105.

In the first embodiment, the depth of the cavity is set so that the resonant frequency defined by the thickness of the vibrating portion 110 is different from the resonant frequency defined by the depth of the cavity 104. Alternatively, the depth of the cavity can be set so that a difference Δf between the resonant frequency defined by the thickness of the vibrating portion 110 and the resonant frequency defined by the depth of the cavity 104 is larger than a desired frequency band (pass band) f of the filter, thereby providing a filter with a smooth band-pass characteristic curve.

For example, a frequency band in the Personal Communications Services (PCS), which is a digital cellular phone services provided in the United States, Canada, and other countries is from 1850 to 1990 MHz. Of these, a pass bandwidth in transmission and reception is 60 MHz. When the piezoelectric resonators are formed in a ladder structure to form a filter, the difference between the resonant frequency defined by the thickness of the vibrating portion 110 and the resonant frequency defined by the depth of the cavity is made equal to or larger than 30 MHz, thereby achieving a smooth pass characteristic curve of a transmission/reception filter.

(Method of Manufacturing a Piezoelectric Resonator According to the First Embodiment)

FIGS. 3A, 3B, 3C, 3D, 3E, 3F, and 3G are diagrams for describing a method of manufacturing the piezoeletric resonator 1 according to the first embodiment. Hereinafter, the method of manufacturing the piezoeletric resonator 1 according to the first embodiment with reference to FIGS. 3A, 3B, 3C, 3D, 3E, 3F, and 3G is described below.

Figure 3A:
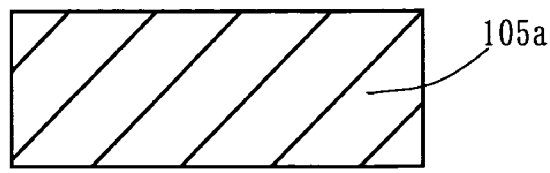
FIGS. 3A, 3B, 3C, 3D, 3E, 3F, and 3G are illustrations for describing a method of manufacturing the piezoelectric resonator 1 according to the first embodiment.

Firstly, as shown in FIG. 3A, a substrate 105a is provided.

Figure 3B:
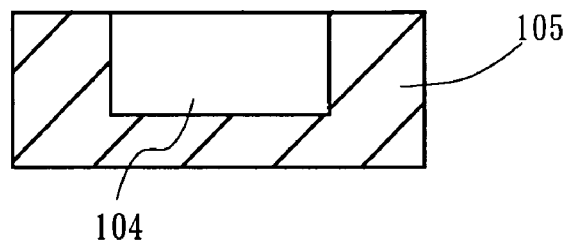

Next, as a preparatory step, the depth of the cavity 104 is determined so that the resonant frequency defined by the thickness of the vibrating portion 110 is different from the resonant frequency defined by the depth of the cavity 104. Then, as shown in FIG. 3B, the cavity 104 having the depth determined in the above manner is provided on the surface of the substrate 105a to form the substrate 105.

Figure 3C:
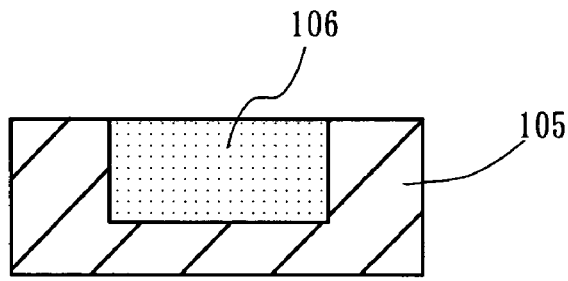

Next, as shown in FIG. 3C, a sacrificial layer 106, which will be removed later, is embedded in the cavity 104. The sacrificial layer 106 is made of a readily-soluble material, such as phosphosilicate glass (PSG).

Figure 3D:
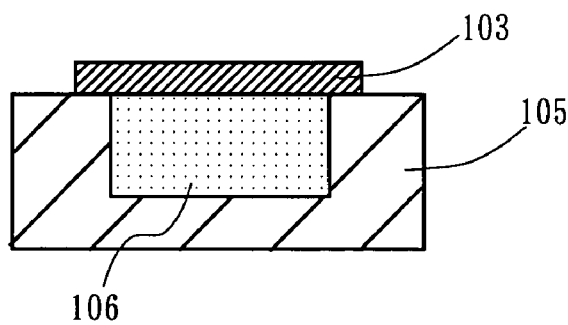

Next, as shown in FIG. 3D, the lower electrode 103 is provided on the substrate 105 across the cavity 104.

Figure 3E:
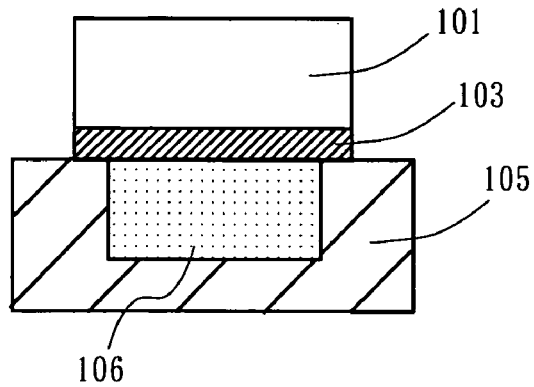

Next, as shown in FIG. 3E, the piezoeletric body 101 is deposited on the substrate 105 so as to cover the lower electrode 103. Deposition is performed through, for example, a spattering scheme or a CVD scheme.

Figure 3F:
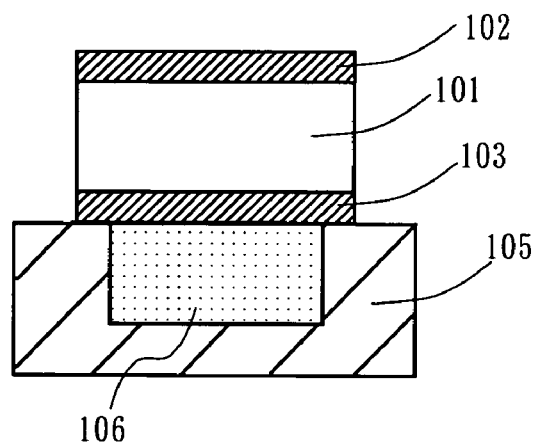

Next, as shown in FIG. 3F, the upper electrode 102 for forming the vibrating portion 110 is provided on the piezoeletric body 101.

Figure 3G:
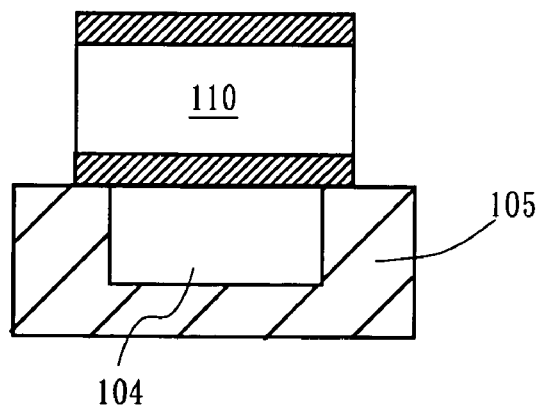

Lastly, as shown in FIG. 3G, the sacrificial layer 106 in the cavity 104 is removed to complete the cavity 104. Removal of the sacrificial layer 106 is performed through dissolving with hydrofluoric aqueous solution or other schemes.

According to the above manufacturing method, the depth of the cavity is determined so that the resonant frequency defined by the thickness of the vibrating portion 110 is different from the resonant frequency defined by the depth of the cavity 104, and the cavity 104 is formed based on the determined depth. Only with such simple processes, a piezoelectric resonator achieving a spurious-resonance suppressing effect can be manufactured. That is, no additional process for suppressing spurious resonance is required, thereby simplifying the manufacturing processes.

Second Embodiment

The structure of a piezoelectric resonator according to a second embodiment is similar to that of the first embodiment, and therefore FIG. 1 is also referred to. In the second embodiment, a resonant frequency fr is based on vibration (½ vibration) with the thickness of the vibrating portion 110 being taken as a half wavelength ($\lambda p/2$). Also, an average of ultrasonic velocity in the material of the cavity 104 (in the substrate 105) is taken as Vc. Furthermore, a value determined based on the resonant frequency fr and the average of ultrasonic velocity Vc is represented as $\lambda c$ (=Vc/fr). In the second embodiment, the depth t2 of the cavity 104 is set so as not to satisfy $(2n-1) \times \lambda c/4$, where n is an integer. Here, when a member (for example, the substrate) forming the cavity is made of a plurality of materials, $\lambda c$ is derived based on an average of ultrasonic velocity Vc in each of these materials (this applies to all of the following embodiments).

Figure 4A:
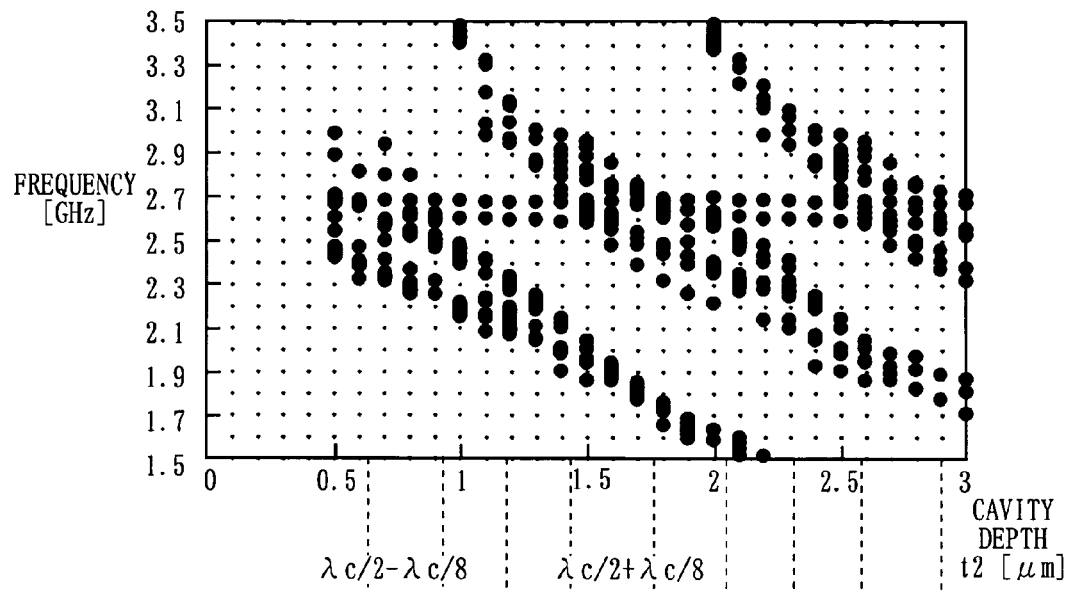
FIG. 4A is a graph showing simulation results regarding a relation between a depth t2 of a cavity 104 and a resonant frequency of resonance excited in the piezoelectric resonator 1 shown in FIG. 1.
Figure 4B:
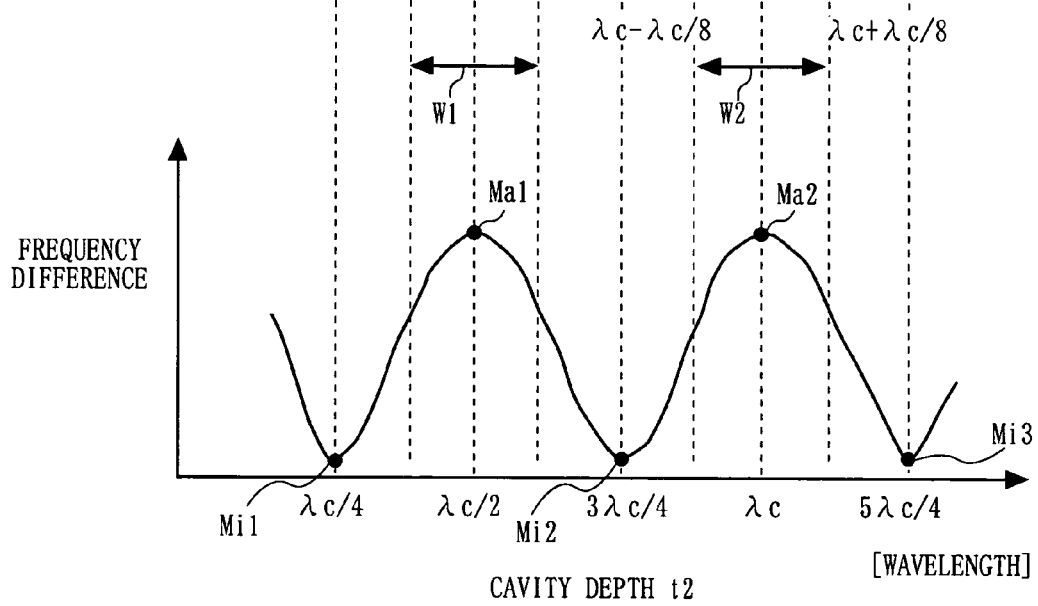
FIG. 4B is a graph showing a frequency difference between a main resonant frequency and a spurious resonant frequency closest to the main resonant frequency in association with the depth of the cavity.

FIG. 4A is a graph showing simulation results regarding a relation between the depth t2 of the cavity 104 and the resonant frequency of vibration excited at the piezoelectric resonator 1 shown in FIG. 1. FIG. 4B is a graph showing a frequency difference between the main resonant frequency and the spurious resonant frequency closest to the main resonant frequency in association with the depth of the cavity. By dotted lines connecting FIGS. 4A and 4B together, the depth of the cavity in FIG. 4A is associated with the depth of the cavity in FIG. 4B.

As has been described with reference to FIG. 2, the main resonant frequency showing an approximately constant value irrespectively of the depth of the cavity is a resonant frequency defined by the thickness t1 of the vibrating portion 110. A resonant frequency varying with the depth of the cavity 104 is the spurious resonant frequency, which depends on the depth t2 of the cavity 104.

As shown in FIG. 4B, when the depth t2 of the cavity 104 is substantially an odd multiple of $\lambda c/4$, the frequency difference between the main resonant frequency and the spurious resonant frequency is minimum. For example, the depths of the cavity 104 at points Mi1, Mi2, and Mi3 shown in FIG. 4B are $\lambda c/4$, $3 \times \lambda c/4$, and $5 \times \lambda c/4$, respectively, and the frequency difference is minimum.

Conversely, when the depth t2 of the cavity 104 is an even multiple of $\lambda c/2$, the frequency difference is maximum. For example, the depths of the cavity 104 at points Ma1 and Ma2 shown in FIG. 4B are $\lambda c/2$ and $\lambda c$, respectively, and the frequency difference is maximum.

Therefore, with a depth at the midpoint between the depth of the cavity with the minimum frequency difference and the depth of the cavity with the maximum frequency being taken as a critical point, whether spurious resonance occurs near the main resonance can be determined. That is, spurious resonance does not occur near the main resonance when the depth of the cavity is equal to or larger than $n \times \lambda c/2 - \lambda c/8$ and equal to or smaller than $n \times \lambda c/2 + \lambda c/8$ (n is an integer), as is the case where the depth of the cavity is equal to or larger than $\lambda c/2 - \lambda c/8$ and equal to or smaller than $\lambda c/2 + \lambda c/8$ (in a range W1 shown in FIG. 4B), or equal to or larger than $\lambda c - \lambda/8$ and equal to or smaller than $\lambda c + \lambda c/8$ (in a range W2 shown in FIG. 4B).

That is, the depth of the cavity 104 is set so as not to be substantially $n \times \lambda c/4$, more particularly, so as to be equal to or larger than $n \times \lambda c/2 - \lambda c/8$ and equal to or smaller than $n \times \lambda c/2 + \lambda c/8$ (n is an integer), thereby suppressing spurious resonance near the resonant frequency of the vibrating portion 110.

As described above, in the second embodiment, the depth of the cavity 104 is determined so as to be equal to or larger than $n \times \lambda c/2 - \lambda c/8$ and equal to or smaller than $n \times \lambda c/2 + \lambda c/8$ (n is an integer). When the above condition is satisfied, the cavity 104 does not resonate at a vibration mode of $\lambda c/4$. Therefore, even if vibration of the vibrating portion 110 is leaked from its supporting portion to the substrate 105, spurious vibration is not excited near the main vibration. As a result, an admittance curve without a spurious resonant frequency between the resonant frequency fr and the anti-resonant frequency fa can be obtained. When a filter is formed by using such a resonator, its band-pass characteristic curve is smooth. Also, depending on the depth of the cavity 104, the main resonant frequency and the spurious resonant frequency can be separated from each other more than a pass band of the filter. In that case, a filter without a spurious resonant frequency within the pass band can be provided.

(Method of Manufacturing a Piezoelectric Resonator According to the Second Embodiment)

With reference to FIGS. 3A, 3B, 3C, 3D, 3E, 3F, and 3G, a method of manufacturing the piezoelectric resonator according to the second embodiment is described below.

Firstly, as shown in FIG. 3A, the substrate 105a is provided.

Next, as a preparatory step, the depth of the cavity 104 is determined so as to be equal to or larger than $n \times \lambda c/2 - \lambda c/8$ and equal to or smaller than $n \times \lambda c/2 + \lambda c/8$.

Thereafter, the procedure goes similarly to the procedure for manufacturing the piezoelectric resonator according to the first embodiment.

According to the above manufacturing method, only by providing a process of setting the depth of the cavity 104 so that the depth is not substantially $n \times \lambda c/4$, more particularly, the depth is equal to or larger than $n \times \lambda c/2 - \lambda c/8$ and equal to or smaller than $n \times \lambda c/2 + \lambda c/8$ (n is an integer), a piezoeletric resonator achieving a spurious resonance suppressing effect can be manufactured. As such, no additional process for suppressing spurious resonation is required, and therefore the manufacturing process can be made easy.

Third Embodiment

The structure of a piezoeletric resonator according to the third embodiment is similar to that of the first embodiment, and therefore FIG. 1 is also referred to. In the third embodiment, the depth t2 of the cavity 104 is set as $n \times \lambda/2$ (n is an integer).

As shown in FIG. 4B, if the depth t2 of the cavity 104 is set as $n \times \lambda/2$, the difference between the main resonant frequency and a spurious resonant frequency closest to the main resonant frequency is the maximum. As a result, no spurious resonant frequency is present near the main resonant frequency.

Figure 5A:
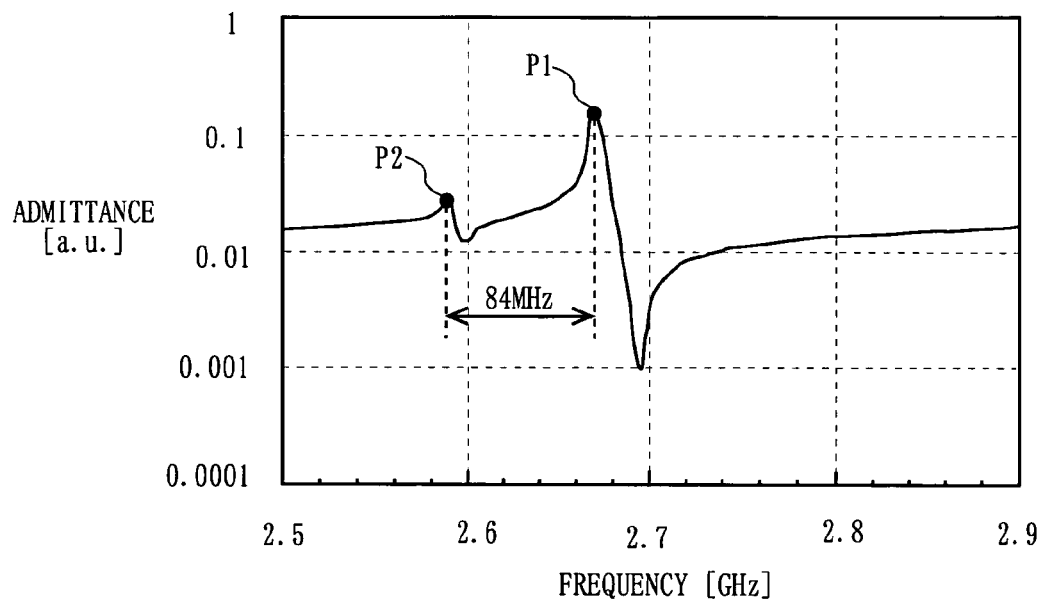
FIG. 5A is a graph showing an admittance characteristic when the depth of the cavity 104 is set as $\lambda c/2$.

FIG. 5A is a graph showing an admittance characteristic when the depth of the cavity 104 is set as $\lambda/2$. That is, FIG. 5A is a gram showing an admittance characteristic at the point Ma1 in FIG. 4B.

Figure 5B:
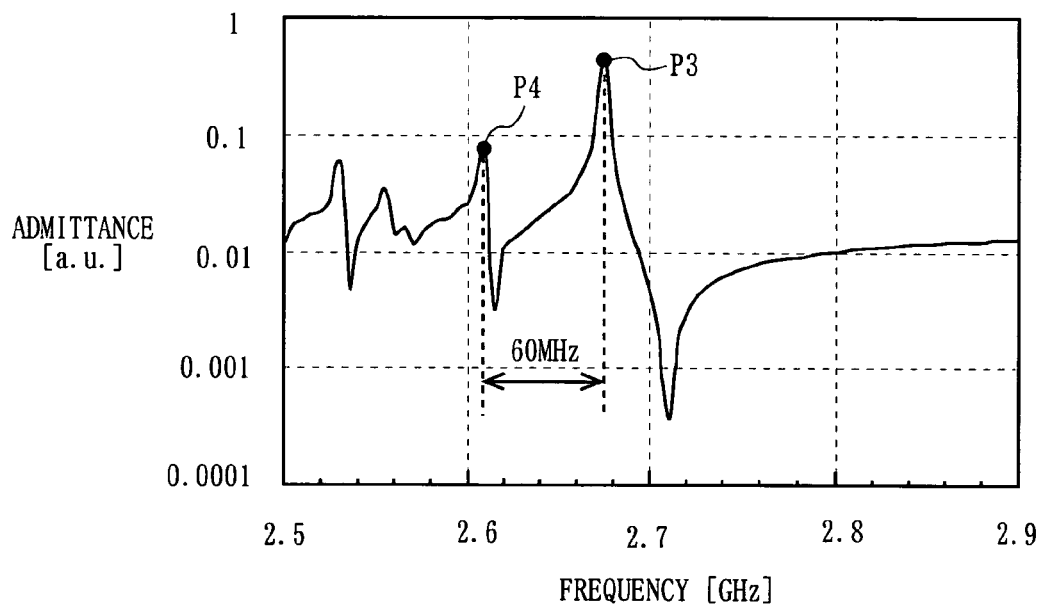
FIG. 5B is a graph showing an admittance characteristic when the depth of the cavity 104 is set near $3\lambda c/4$.

FIG. 5B is a graph showing an admittance characteristic when the depth of the cavity 104 is set close to $3\lambda c/4$. That is, FIG. 5B is a gram showing an admittance characteristic at the point Mi2 in FIG. 4B.

As shown in FIG. 5A, when the depth of the cavity 104 is set as $\lambda/2$, a difference between a main resonant frequency near 2.66 GHz (a point P1) and a spurious resonant frequency near 2.58 GHz (a point P2) is 84 MHz. When this piezoeletric resonator is used to form a band-pass filter with its pass bandwidth being approximately 40 MHz, its pass characteristic curve will not have spurious resonance in the pass-band.

On the other hand, as shown in FIG. 5B, when the depth of the cavity 104 is set as $3\lambda c/4$, a difference between a main resonant frequency near 2.67 GHz (a point P3) and a spurious resonant frequency near 2.61 GHz (a point P4) is 60 MHz. The frequency difference of such a degree indicates that a spurious resonant frequency is present near the main resonant frequency (2.67 GHz). When this piezoelectric resonator is used to form a band-pass filter with its pass bandwidth is approximately 40 MHz, its pass characteristic curve will have spurious resonance in the pass-band.

As such, in the third embodiment, the depth of the cavity 104 is set as $n \times \lambda c/2$. With this, an admittance curve without a spurious resonant frequency between the resonant frequency fr and the anti-resonant frequency fa can be obtained, wherein the spurious resonant frequency is separated the most from the main resonant frequency. When such a resonator is used to form a filter, its band-pass characteristic curve will be smooth over a wide band.

In the third embodiment, the depth of the cavity 104 can be set near $n \times \lambda c/2$ to achieve similar effects. That is, even if the depth of the cavity does not exactly coincide with $n \times \lambda c/2$, similar effects can be achieved, and thus such a resonator is considered as being equivalent in designed to the resonator according to the present invention.

Fourth Embodiment

In the first to third embodiments, as shown in FIG. 1, the piezoeletric resonator having the cavity 104 formed on an upper portion of the substrate 105 is described. However, this is not meant to restrict the structure of the piezoelectric resonator. In a fourth embodiment, various exemplary modifications are described.

Figure 6A:
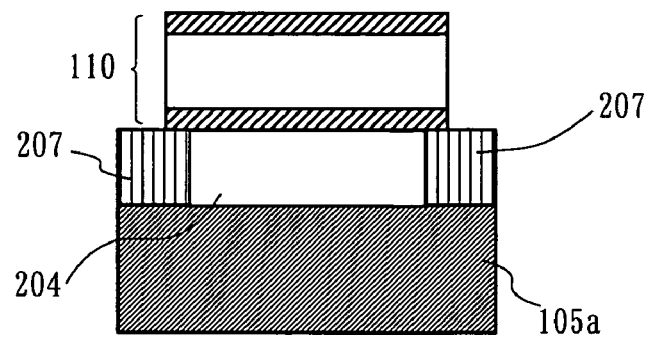
FIG. 6A is a section view of a piezoelectric resonator with a cavity formed by a supporting portion.

FIG. 6A is a section view showing a structure of the piezoeletric resonator with a cavity formed by a supporting portion 207. As shown in FIG. 6A, the supporting portion 207 may be provided on the substrate 105a to form a cavity 204. In this way, the lower electrode 103 may be formed above the substrate 105a with the supporting portion 207. Also in this structure, the depth of the cavity 204 is determined according to the conditions described in the first through third embodiments, thereby reducing a spurious resonant frequency near the main resonant frequency. Also, the cavity 204 is formed by depositing the supporting portion 207, thereby making it possible to accurately control the depth of the cavity 204. Such control is quite effective in manufacturing. Furthermore, if the supporting portion 207 is made of a material with a high acoustic impedance, the range of selection of the material of the substrate 105 can be extended, and also an effect of reducing spurious resonance can be achieved. In FIG. 6A, $\lambda c$ is defined based on an average of ultrasonic velocity Vc1 in the supporting portion 207 and the substrate 105a and the resonant frequency fr defined by the thickness of the vibrating portion 110. That is, $\lambda c = Vc1/fr$.

Figure 6B:
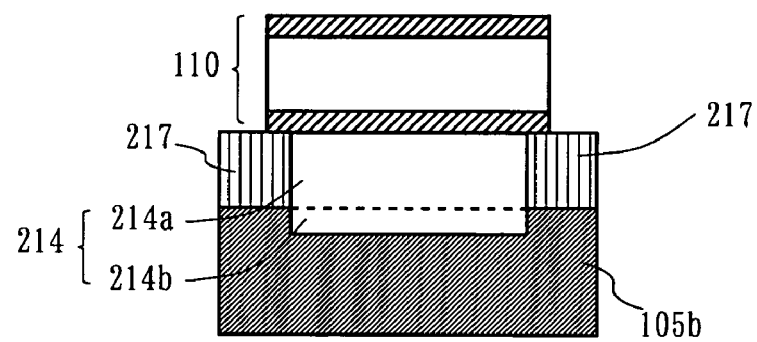
FIG. 6B is a section view of a piezoelectric resonator with a cavity formed by providing a supporting portion with a substrate surface being etched.

FIG. 6B is a section view showing a structure of a piezoeletric resonator with a cavity formed by etching the surface of the substrate and providing a supporting portion. As shown in FIG. 6B, the surface of the substrate 105b is etched to form a concave portion 214b. In addition, a supporting portion 217 is formed to make a hollow portion 214a. Also in this structure, the depth of the cavity 214 is determined according to the conditions described in the first through third embodiments, thereby reducing a spurious resonant frequency near the main resonant frequency. Also, the cavity 214 is formed by etching the surface of the substrate 105 and also depositing the supporting portion 217, thereby making it possible to accurately control the depth of the cavity 204. Such control is quite effective in manufacturing. Furthermore, if the supporting portion 217 is made of a material with a high acoustic impedance, an effect of further reducing spurious resonance can be achieved. In FIG. 6B, $\lambda c$ is defined based on an average of ultrasonic velocity Vc2 in the supporting portion 217 and the substrate 105b and the resonant frequency fr defined by the thickness of the vibrating portion 110. That is, $\lambda c = Vc2/fr$.

Figure 6C:
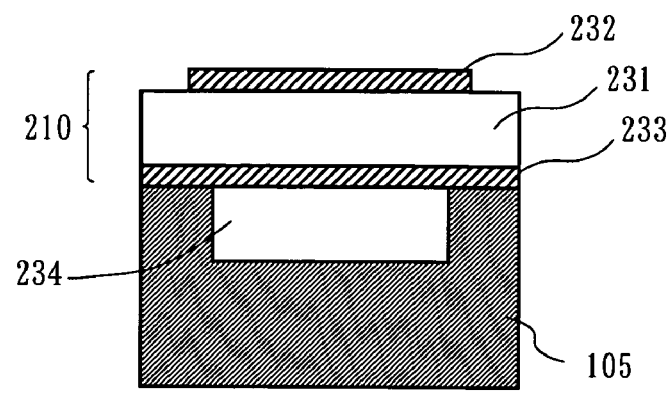
FIG. 6C is a section view showing another structure of the piezoelectric resonator shown in FIG. 1 in which the size of an upper surface of a piezoelectric body 231 is made different from the size of a lower surface of an upper electrode 232.
Figure 6D:
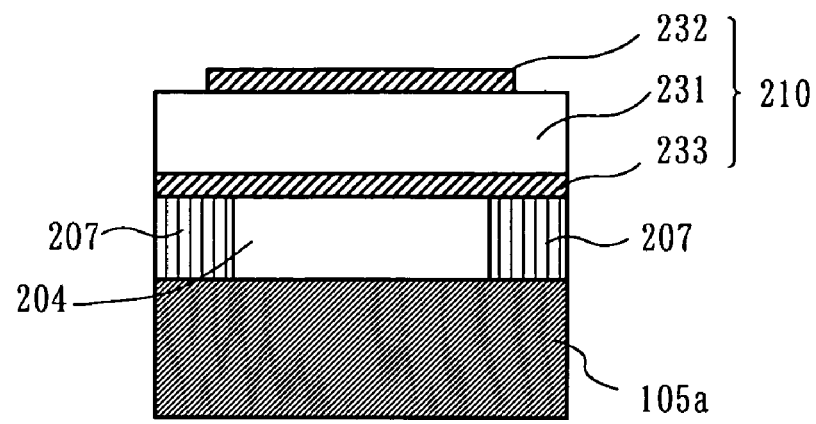
FIG. 6D is a section view showing another structure of the piezoelectric resonator shown in FIG. 6A in which the size of the upper surface of a piezoelectric body 231 is made different from the size of the lower surface of the upper electrode 232.
Figure 6E:
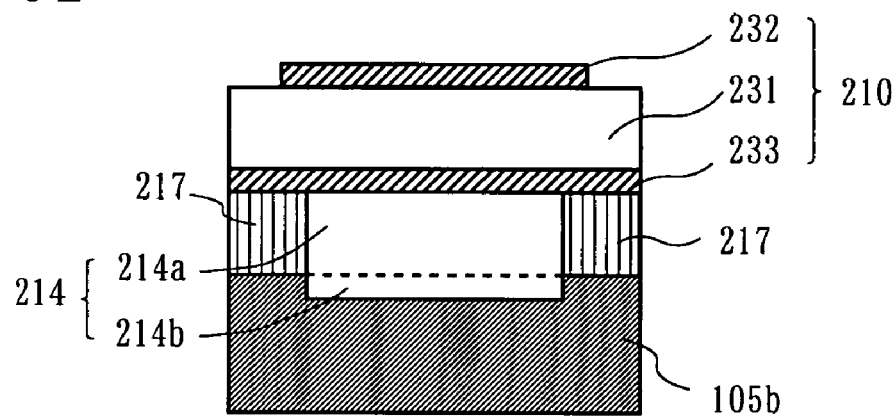
FIG. 6E is a section view showing another structure of the piezoelectric resonator shown in FIG. 6B in which the size of the upper surface of a piezoelectric body 231 is made different from the size of the lower surface of the upper electrode 232.

FIG. 6C is a section view showing another structure of the piezoelectric resonator shown in FIG. 1 in which the size of an upper surface of a piezoelectric body 231 is made different from the size of a lower surface of an upper electrode 232. FIG. 6D is a section view showing another structure of the piezoelectric resonator shown in FIG. 6A in which the size of the upper surface of the piezoelectric body 231 is made different from the size of the lower surface of the upper electrode 232. FIG. 6E is a section view showing another structure of the piezoelectric resonator shown in FIG. 6B in which the size of the upper surface of a piezoelectric body 231 is made different from the size of the lower surface of the upper electrode 232.

As shown in FIGS. 6C through 6E, a vibrating portion 210 is formed so that the size of the upper surface of a piezoelectric body 231 is made different from the size of the lower surface of the upper electrode 232 and the size of the lower surface of the piezoelectric body 231 is made equal to the size of the upper surface of the lower electrode 233. Also in this case, if the depth of cavities 234, 204, and 214 are made in accordance with the conditions in the first through third embodiments, effects similar to those achieved in the first through third embodiments can be achieved. Also in this case, $\lambda c$ is defined based on an average of ultrasonic velocity in the material forming the cavity and the resonant frequency fr of the vibrating portion.

Note that, even if the size of the lower surface of the piezoelectric body 231 is different from the size of the upper surface of the lower electrode 233, effects similar to those achieved in the first through third embodiments can be achieved. Further, FIGS. 17A, 17B, 17C, 17D, 17E, 18A, 18B, 18C, 18D, and 18E show that the cavities 204, 214, and 234 each has a trapezoidal shape in cross section.

Fifth Embodiment

FIGS. 7A, 7B, 7C, 7D, 7E, 7F, and 7G are illustrations for describing a method of manufacturing the piezoeletric resonator shown in FIG. 6A. With reference to FIGS. 7A, 7B, 7C, 7D, 7E, 7F, and 7G, the method of manufacturing the piezoeletric resonator shown in FIG. 6A is described below.

Figure 7A:
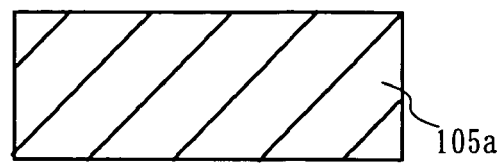
FIGS. 7A, 7B, 7C, 7D, 7E, 7F, and 7G are illustrations for describing a method of manufacturing the piezoelectric resonator shown in FIG. 6A.

Firstly, as shown in FIG. 7A, the substrate 105a is provided.

Next, as a preparatory step, the depth of the cavity is determined in accordance with any of the first through third embodiments. That is, the depth of the cavity is determined so that the resonant frequency defined by the thickness of the vibrating portion is made different from the resonant frequency defined by the depth of the cavity; the depth of the cavity is set so as to be equal to or larger than $n \times \lambda c/2 - \lambda c/8$ and equal to or smaller than $n \times \lambda c/2 + \lambda c/8$ (n is an integer); or the depth of the cavity is set as $n \times \lambda c/2$ (n is an integer). Then, the determined depth of the cavity is determined as the height of the supporting portion 207.

Figure 7B:
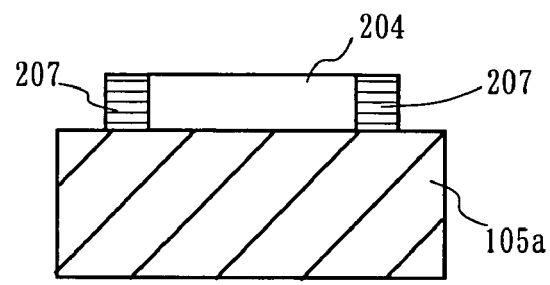

Then, as shown in FIG. 7B, the supporting portion 207 is formed with the determined height on the surface of the substrate 105a.

Figure 7C:
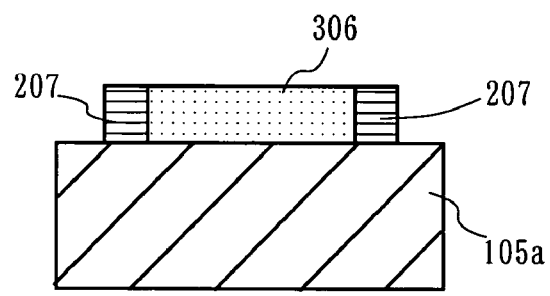

Next, as shown in FIG. 7C, a sacrificial layer 306, which will be removed later, is embedded in the supporting portion 207. The sacrificial layer 106 is made of a readily-soluble material, such as phosphosilicate glass (PSG).

Figure 7D:
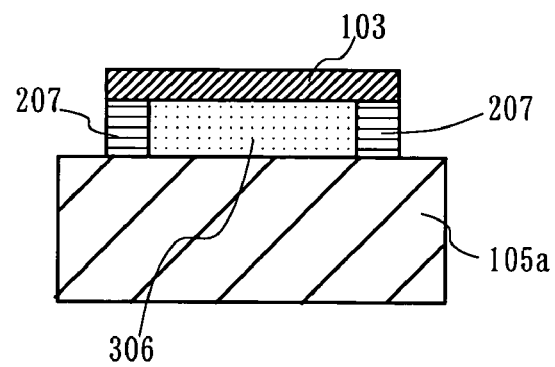

Next, as shown in FIG. 7D, the lower electrode 103 is provided on the substrate 105a across the supporting portion 207.

Figure 7E:
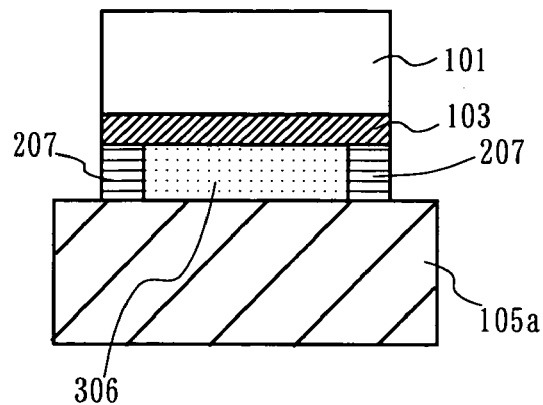

Next, as shown in FIG. 7E, the piezoelectric body 101 is deposited above the supporting portion 207 and the sacrificial layer 306 so as to cover the lower electrode 103. Deposition is performed through, for example, a spattering scheme or a CVD scheme.

Figure 7F:
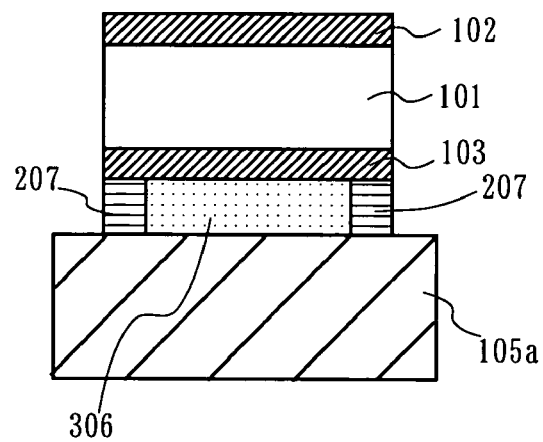

Next, as shown in FIG. 7F, the upper electrode 102 is formed on the piezoelectric body 101.

Figure 7G:
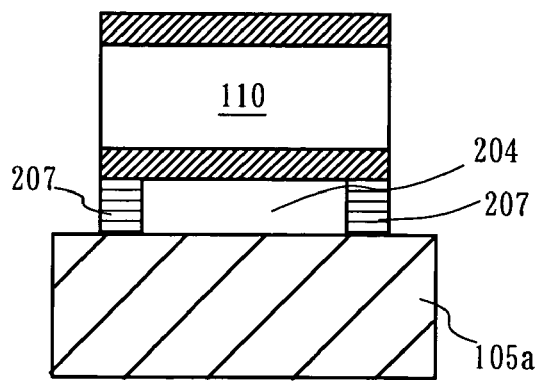

Lastly, as shown in FIG. 7G, the sacrificial layer 306 in the cavity 204 is removed to complete the cavity 204. Removal of the sacrificial layer 306 is performed through dissolving with hydrofluoric aqueous solution or other schemes.

As such, according to the fifth embodiment, the depth of the cavity is determined according to any of the first through third embodiments, and a supporting portion having a height equal to the depth is formed. With only such simple processes, a piezoeletric resonator achieving a spurious-resonance suppressing effect can be manufactured. That is, no additional process for suppressing spurious resonance is required, thereby simplifying the manufacturing processes.

Sixth Embodiment

FIGS. 8A, 8B, 8C, 8D, 8E, 8F, and 8G are illustrations for describing a method of manufacturing the piezoeletric resonator shown in FIG. 6B. With reference to FIGS. 8A, 8B, 8C, 8D, 8E, 8F, and 8G, the method of manufacturing the piezoeletric resonator shown in FIG. 6B is described below.

Figure 8A:
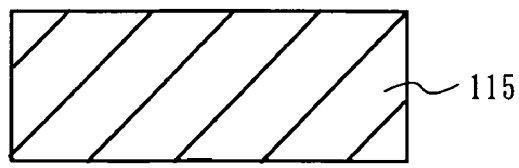
FIGS. 8A, 8B, 8C, 8D, 8E, 8F, and 8G are illustrations for describing a method of manufacturing the piezoelectric resonator shown in FIG. 6B.

Firstly, as shown in FIG. 8A, a substrate 115 is provided.

Next, the depth of the cavity is determined in accordance with any of the first through third embodiments. That is, the depth of the cavity is determined so that the resonant frequency defined by the thickness of the vibrating portion is made different from the resonant frequency defined by the depth of the cavity; the depth of the cavity is set so as to be equal to or larger than $n \times \lambda c/2 - \lambda c/8$ and equal to or smaller than $n \times \lambda c/2 + \lambda c/8$ (n is an integer); or the depth of the cavity is set as $n \times \lambda c/2$ (n is an integer). Here, in the sixth embodiment, the determined depth of the cavity is referred to as a set value.

Figure 8B:
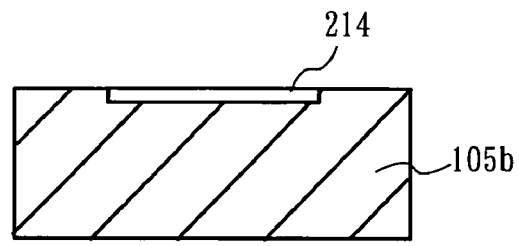

Next, as shown in FIG. 8B, the surface of the substrate 115 is etched to form the substrate 105b and the concave portion 214b.

Figure 8C:
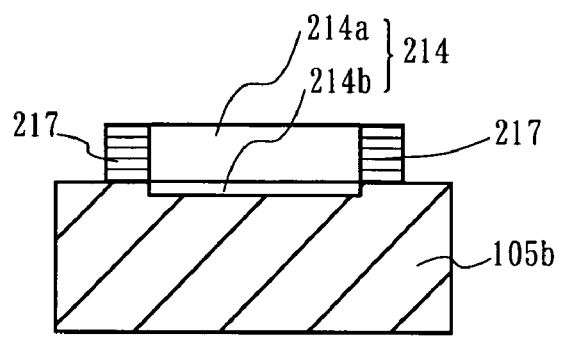

Next, as shown in FIG. 8C, the supporting portion 217 is formed around the etched area. At this time, the height of the supporting portion 217 is adjusted so that the depth of the cavity 214 formed by the concave portion 214b and the hollow portion 214a has the set value.

Figure 8D:
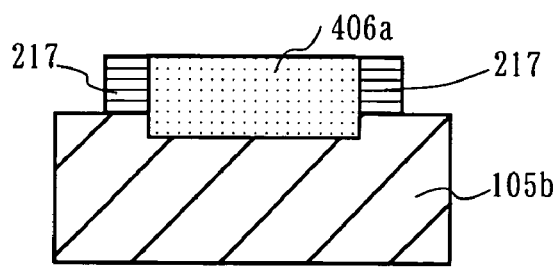

Next, as shown in FIG. 8D, a sacrificial layer 406a which will be removed later, is embedded in the cavity 214. The sacrificial layer 406a is made of a readily-soluble material, such as phosphosilicate glass (PSG).

Figure 8E:
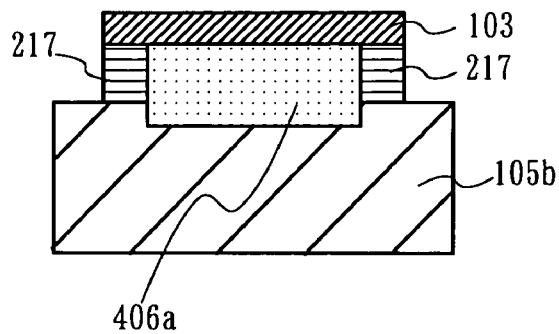

Next, as shown in FIG. 8E, the lower electrode 103 is provided across the supporting portion 217 and the sacrificial layer 406a in the cavity 214.

Figure 8F:
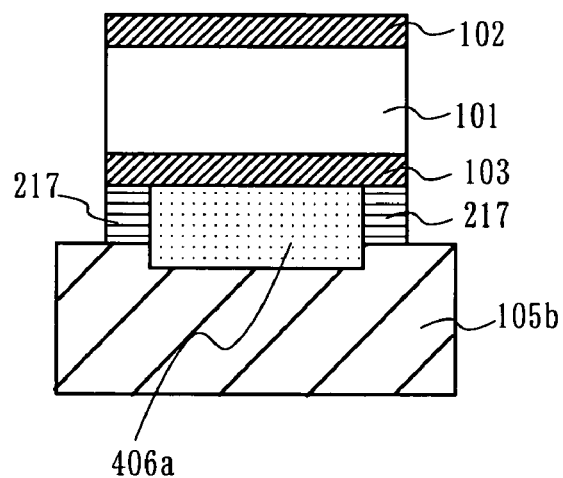

Next, as shown in FIG. 8F, the piezoeletric body 101 is deposited so as to cover the lower electrode 103, and then the upper electrode 102 is deposited on the piezoeletric body 101. Deposition is performed through, for example, a spattering scheme or a CVD scheme.

Figure 8G:
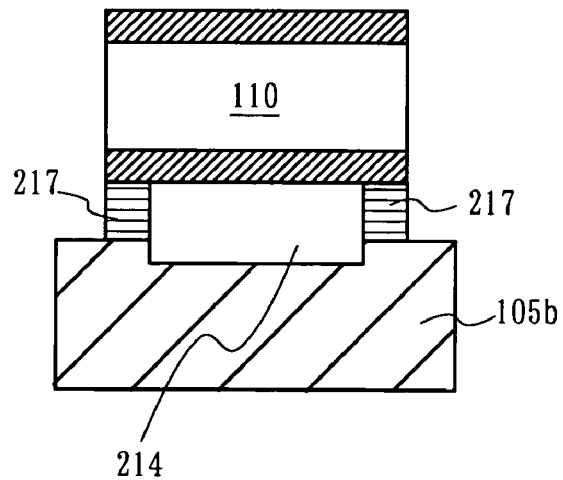

Lastly, as shown in FIG. 8G, the sacrificial layer 406a is removed to complete the cavity 214. Removal of the sacrificial layer 406a is performed through dissolving with hydrofluoric aqueous solution or other schemes.

As such, according to the sixth embodiment, the depth of the cavity is determined according to any of the first through third embodiments, and a supporting portion having a height equal to the depth is formed. With only such simple processes, a piezoeletric resonator achieving a spurious-resonance suppressing effect can be manufactured. That is, no additional process for suppressing spurious resonance is required, thereby simplifying the manufacturing processes.

Note that the piezoeletric resonators shown in FIGS. 6C, 6D, and 6E can be manufactured by using any of the methods shown in FIGS. 3, 7, and 8 with a change in a range of forming the lower electrode and the piezoeletric body.

Seventh Embodiment

A piezoeletric resonator according to a seventh embodiment is different from that of the first embodiment in that the bottom portion of the cavity formed by etching the substrate is provided with an adjusting layer for adjusting the depth of the cavity.

FIGS. 9A, 9B, 9C, 9D, 9E, and 9F are illustrations for describing a method of manufacturing a piezoeletric resonator according to the seventh embodiment. With reference to FIGS. 9A, 9B, 9C, 9D, 9E, and 9F, the method of manufacturing the piezoeletric resonator according to the seventh embodiment is described below.

Figure 9A:
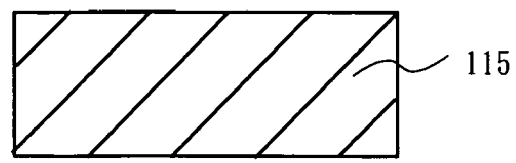
FIGS. 9A, 9B, 9C, 9D, 9E, and 9F are illustrations for describing a method of manufacturing a piezoelectric resonator according to a seventh embodiment.

Firstly, as shown in FIG. 9A, the substrate 115 is provided.

Next, the depth of the cavity is determined in accordance with any of the first through third embodiments. That is, the depth of the cavity is determined so that the resonant frequency defined by the thickness of the vibrating portion is made different from the resonant frequency defined by the depth of the cavity; the depth of the cavity is set so as to be equal to or larger than $n \times \lambda c/2 - \lambda c/8$ and equal to or smaller than $n \times \lambda c/2 + \lambda c/8$ (n is an integer); or the depth of the cavity is set as $n \times \lambda c/2$ (n is an integer). Here, in the seventh embodiment, the determined depth of the cavity is referred to as a set value.

Figure 9B:
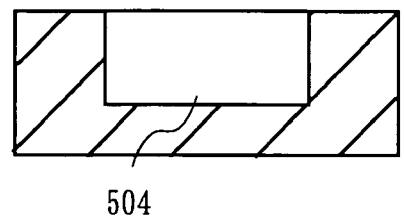

As shown in FIG. 9B, the substrate 115 is etched for partial removal. At this time, the depth of a concave portion 504 is higher than the set value.

Figure 9C:
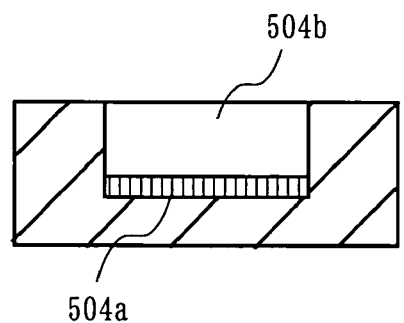

Next, as shown in FIG. 9C, a cavity-depth adjusting layer 504a is formed on the bottom portion of the concave portion 504. At this time, the thickness of the cavity-depth adjusting layer 504a is adjusted so that the depth of the cavity 504b has the set value.

Figure 9D:
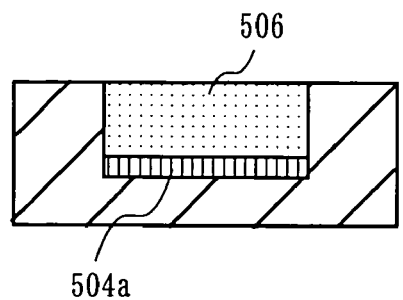

Next, as shown in FIG. 9D, a sacrificial layer 506, which will be removed later, is embedded in the cavity 504b. The sacrificial layer 506 is made of a readily-soluble material, such as phosphosilicate glass (PSG).

Figure 9E:
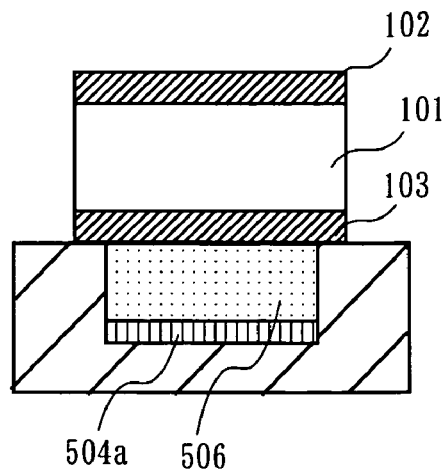

Next, as shown in FIG. 9E, the lower electrode 103 is deposited across the sacrificial layer 506 of the cavity 504b. Then, the piezoeletric body 101 is deposited so as to cover the lower electrode 103. Then, the upper electrode 102 is deposited on the piezoeletric body 101. Deposition is performed through, for example, a spattering scheme or a CVD scheme.

Figure 9F:
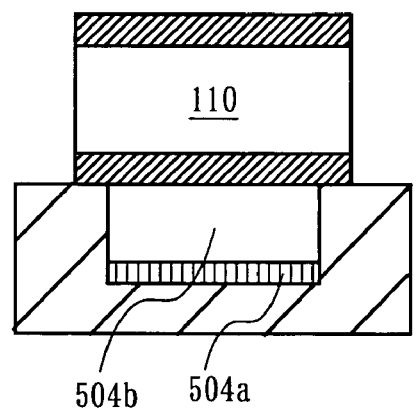

Lastly, as shown in FIG. 9F, the sacrificial layer 506 is removed to complete the cavity 504b. Removal of the sacrificial layer 506 is performed through dissolving with hydrofluoric aqueous solution or other schemes.

Figure 19A:
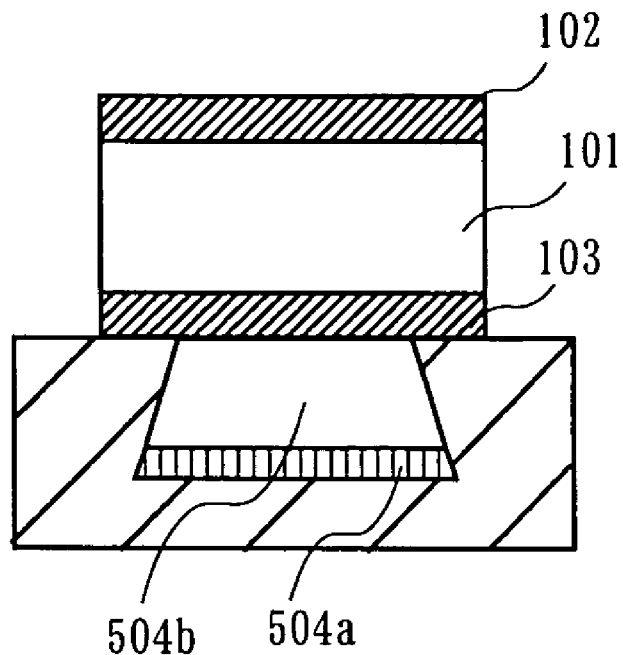
FIGS. 19A and 19B are section views of other piezoelectric resonators of the present invention.
Figure 19B:
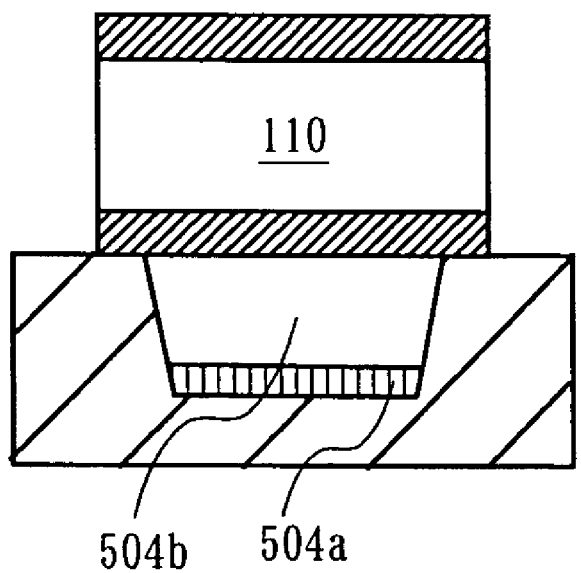

FIGS. 19A and 19B show that the cavity 504b has a trapezoidal shape in cross section.

As such, according to the seventh embodiment, the depth of the cavity is determined according to any of the first through third embodiments, and then an adjusting layer is formed to form a cavity having the determined depth. With only such simple processes, a piezoeletric resonator achieving a spurious-resonance suppressing effect can be manufactured. That is, no additional process for suppressing spurious resonance is required, thereby simplifying the manufacturing processes.

In the first to seventh embodiments, the piezoeletric body is adhered on the lower electrode. Alternatively, a dielectric body may be inserted between the lower electrode and the piezoeletric body. That is, the piezoeletric body can be positioned arbitrarily as long as it is formed on or above the lower electrode. Also, a dielectric body may be inserted between the piezoeletric body and the upper electrode. That is, the upper electrode can be positioned arbitrarily as long as it is formed on or above the piezoeletric body. In this way, when a dielectric body is inserted, the resonant frequency fr is defined by the thickness of the vibrating portion including the dielectric body.

Eighth Embodiment

Figure 10:
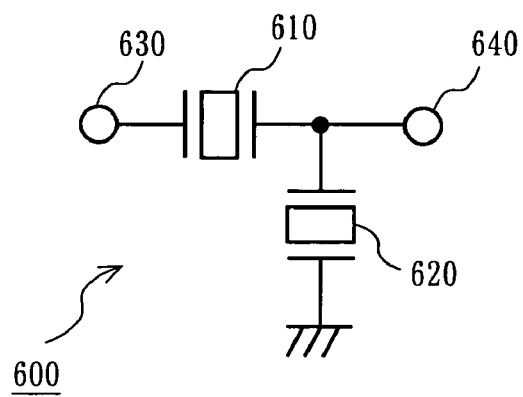
FIG. 10 is an illustration showing the structure of a ladder-type filter 600 according to an eighth embodiment of the present invention.

Next, with reference to FIG. 10, a structure of a ladder-type filter to which the piezoeletric resonator according to the present invention is applied is described.

FIG. 10 is an illustration showing the structure of a ladder-type filter 600 according to the eighth embodiment of the present invention. In FIG. 10, the ladder-type filter 600 includes a first piezoeletric resonator 610, a second piezoeletric resonator 620, and input/output terminals 630 and 640. The first and second piezoeletric resonators 610 and 620 each have a cavity defined according to the conditions described in any of the first through third embodiments.

The first piezoeletric resonator 610 is connected in series between the input/output terminals 630 and 640. Therefore, the first piezoeletric resonator 610 operates as a serial resonator.

The second piezoeletric resonator 620 is connected in parallel between the input/output terminals 630 and 640. Therefore, the second piezoeletric resonator 620 operates as a parallel resonator.

With such connections of these piezoeletric resonators, a ladder-shaped filter having an L-shaped structure is formed.

The resonant frequency of the first piezoeletric resonator 610 is set to be different from the resonant frequency of the second piezoeletric resonator 620. Furthermore, the resonant frequency of the first piezoeletric resonator 610 is set to be higher than the resonant frequency of the second piezoelectric resonator 620. With this, a ladder-type filter having a band-pass characteristic is achieved. Preferably, the resonant frequency of the first piezoeletric resonator 610 is set so as to be equal to or near the resonant frequency of the second piezoeletric resonator 620, thereby achieving a ladder-type filter excellent in band-pass flatness.

In the eighth embodiment, the piezoelectric resonator according to the present invention is applied to a one-step ladder-type filter. Alternatively, the piezoelectric resonator may be used for a multiple-step ladder-type filter.

Also, in the eighth embodiment, the filter has an L-shaped ladder structure. Alternatively, even with a filter having a T-shaped or π-shaped ladder structure, similar effects can be achieved. Furthermore, it goes without saying that a multiple-step ladder filter having a T-shaped or π-shaped ladder structure can achieve similar effects.

Still further, not only the ladder-type but also the lattice-type filter structure can achieve similar effects. That is, the structure of the filter is not meant to be restricted to the above, and the filter can have an arbitrary structure as long as at least one piezoeletric resonator according to the present invention is used.

Ninth Embodiment

Figure 11:
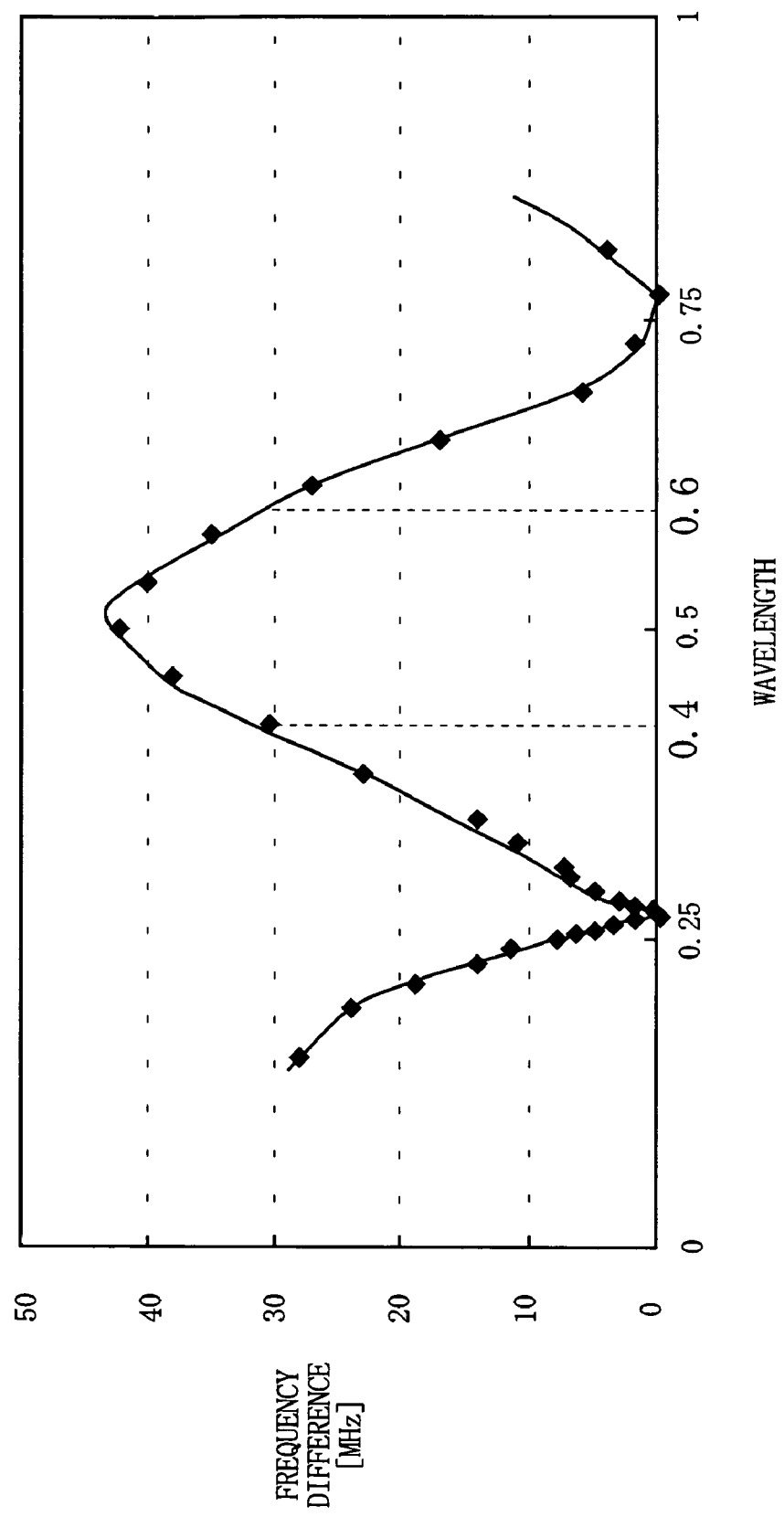
FIG. 11 is a graph showing a difference between a main resonant frequency and a spurious resonant frequency closest to the main resonant frequency in accordance with the depth of a cavity in a piezoelectric resonator having the main resonant frequency in a PCS band.

The structure of a piezoeletric resonator according to a ninth embodiment is similar to that of the first embodiment, and therefore FIG. 1 is also referred to. In the ninth embodiment, a piezoeletric resonator having a main resonant frequency in a PCS band is described. FIG. 11 is a graph showing a difference between the main resonant frequency and a spurious resonant frequency closest to the main resonant frequency in accordance with the depth of a cavity in the piezoeletric resonator having the main resonant frequency in the PCS band. In FIG. 11, the horizontal axis represents values of the depth of the cavity 104 normalized by the wavelength $\lambda c$. The vertical axis represents a difference between the main resonant frequency and the spurious resonant frequency closest to the main resonant frequency (hereinafter, a frequency difference).

The PCS frequency band is 1850 to 1990 MHz. Of these, pass-bandwidth for transmission and reception is 60 MHz. Therefore, when the ladder-type filter as shown in FIG. 10 is formed, the piezoeletric resonator is required as such that no spurious resonance is present in a range of a ½ frequency (that is, 30 MHz) of the pass-bandwidth. As evident from FIG. 11, no spurious resonance is present in a frequency range of a half of the pass-bandwidth when the depth of the cavity 104 is within a range of $0.4\lambda c$ to $0.6\lambda c$. Furthermore, when the depth of the cavity 104 is $0.6\lambda c$, the difference between the resonant frequency and the spurious resonant frequency is maximum, and therefore influences of spurious resonance to the pass-band of the filter are considered as minimum.

In FIG. 11, the difference between the main resonant frequency and the spurious resonant frequency near $0.5\lambda c$ has been described. Such description can also be applied to $1.5\lambda c$, $1.5\lambda c$, $2.4\lambda c$, ... That is, when n is an integer, the depth of the cavity 104 is set so as to be equal to or larger than $n\times\lambda c/2 - 0.1\lambda c$ and equal to or smaller than $n\times\lambda c/2 + 0.1\lambda c$, a filter with a flat band-pass characteristic can be achieved.

In the ninth embodiment, the depth of the cavity of the piezoeletric resonator with a main resonant frequency in the PCM band is described. Such description can also be applied to other frequency bands. That is, also in piezoeletric resonators with a main resonant frequency in a pass-band of Wide-band Code Division Multiple Access (W-CDMA), Universal Mobile Telecommunications System (UMTS), Global System for Mobile (GSM), or the like, the depth of the cavity is designed so that no spurious resonance is present within a frequency range of a half of a desired pass-bandwidth. With this, a filter having a flat band-pass characteristic can be achieved.

As such, when a band-pass filter is formed by using the piezoeletric resonator according to the present invention, the depth of the cavity is determined so that no spurious resonance is present within a frequency range of a half of a desired pass-bandwidth. With this, a filter having a flat band-pass characteristic can be achieved. Particularly, when such a band-pass filter is used for PCM, the depth of the cavity is set so as to be equal to or larger than $n\times\lambda c/2 - 0.1\lambda c$ and equal to or smaller than $n\times\lambda c/2 + 0.1\lambda c$, no spurious resonance occurs for 30 MHz. Therefore, a flat band-pass characteristic for 60 MHz, which is the pass-band, can be achieved.

Conventionally, in order to obtain a flat band-pass characteristic, the impedance of an inductor in the resonator is adjusted, for example. To achieve this, a complex scheme has to be often taken, such as significantly changing the structure of the resonator. However, when a band-pass filter is formed by using the piezoeletric resonator according to the present invention, only a simple scheme of changing the depth of the cavity is used to achieve a flat band-pass characteristic. This is quite effective in practical use.

Tenth Embodiment

In a tenth embodiment, an antenna duplexer and a communication device using any of the piezoeletric resonators of the above embodiments are described.

Figure 12:
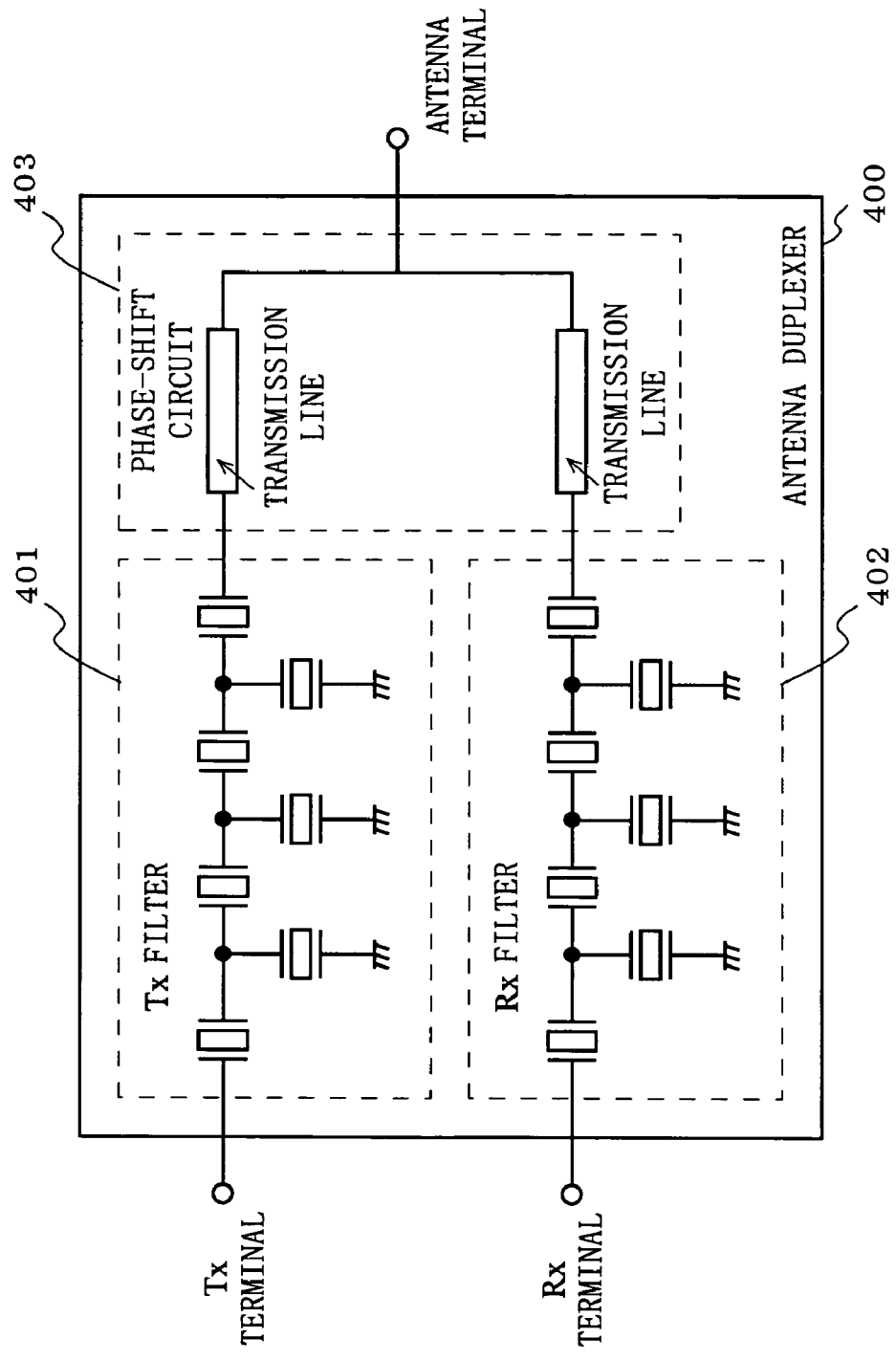
FIG. 12 is an illustration showing an example of a structure of an antenna duplexer 400 according to a tenth embodiment of the present invention.

FIG. 12 is an illustration showing an example of a structure of an antenna duplexer 400 according to the tenth embodiment of the present invention. In FIG. 12, the antenna duplexer 400 includes a Tx filter (a transmission filter) 401 to which the piezoeletric resonator according to the present invention is applied, an Rx filter (a reception filter) 402, and a phase-shift circuit 403 formed by two transmission lines. The Tx filter 401 lets a signal in a transmission band pass therethrough and attenuates a signal in a reception band. The Rx filter 402 lets a signal in a reception band pass therethrough and attenuates a signal in a transmission band. With this, an antenna duplexer excellent in characteristic, such as low loss can be achieved. Note that the number of filters, the number of steps of piezoelectric resonators forming a filter, and the like are not meant to be restricted to those exemplarily shown in FIG. 12, and can be arbitrarily designed. Also, the piezoelectric resonators forming the Tx filter 401 and/or the Rx filter 402 may be arbitrary as long as at least one of these piezoelectric resonators is the one according to the present invention.

Figure 13:
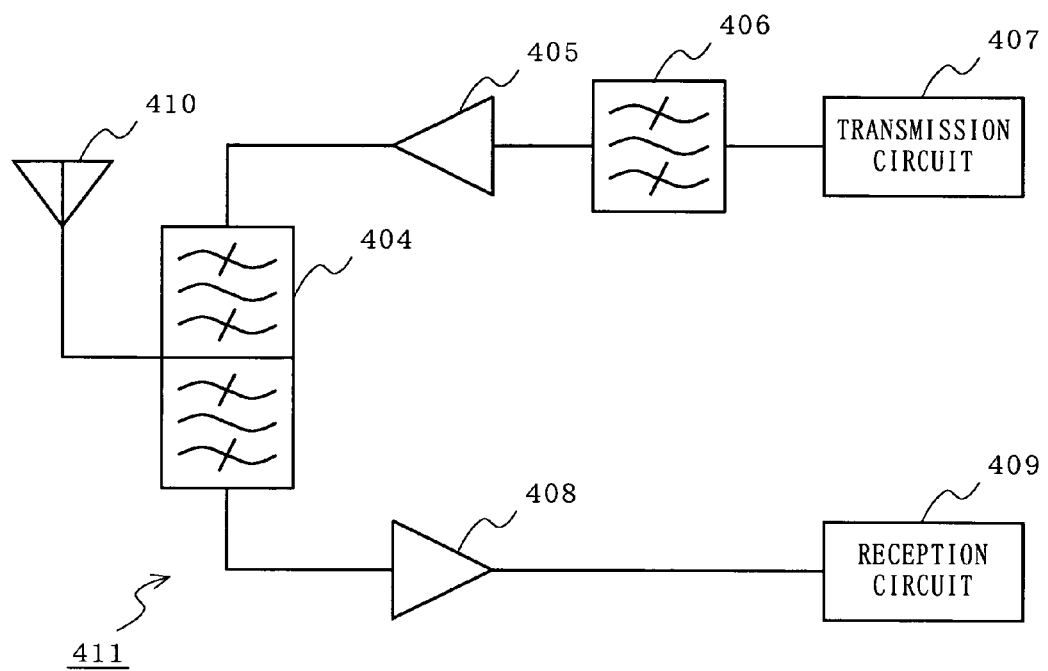
FIG. 13 is an illustration showing an example of a communication device 411 according to the tenth embodiment of the present invention.
Figure 14A:
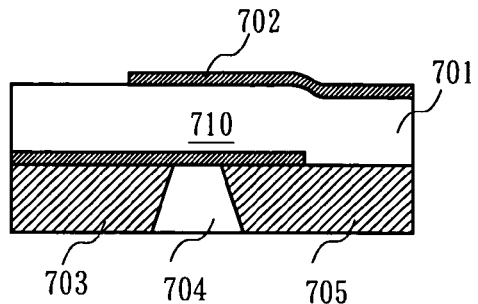
FIG. 14A is a section view showing a basic structure of a conventional piezoelectric resonator 710.
Figure 14B:
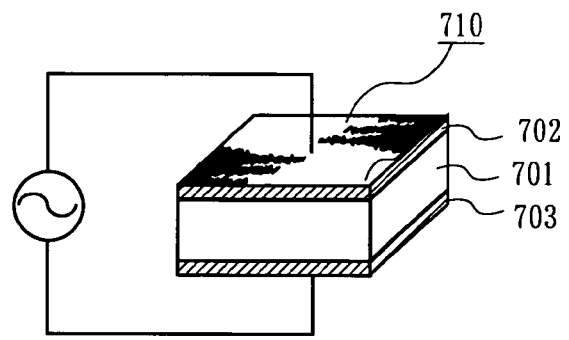
FIG. 14B is a schematic perspective view for describing the operation of the piezoelectric resonator 710.
Figure 14C:
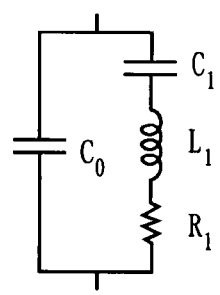
FIG. 14C is a diagram showing an equivalent circuit of the piezoelectric resonator 710.
Figure 14D:
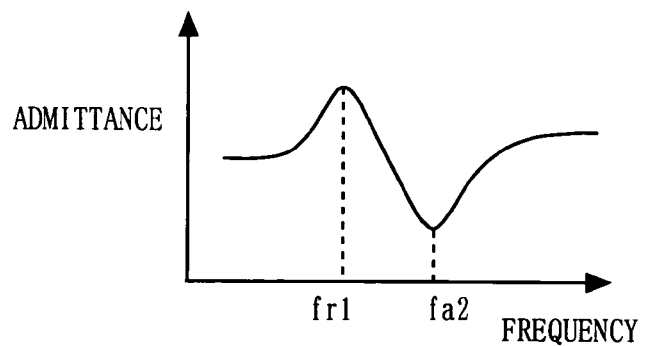
FIG. 14D is a graph showing a frequency characteristic of admittance in an equivalent circuit shown in FIG. 14C.
Figure 15A:
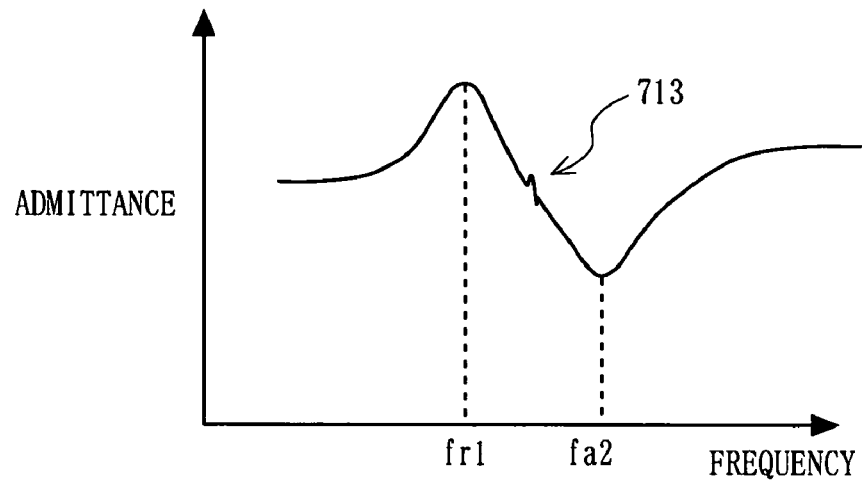
FIG. 15A is a graph indicative of a frequency characteristic of admittance when spurious vibration occurs.
Figure 15B:
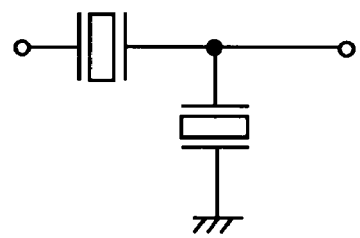
FIG. 15B is a circuit diagram showing the structure of a filter using a piezoelectric resonator.
Figure 15C:
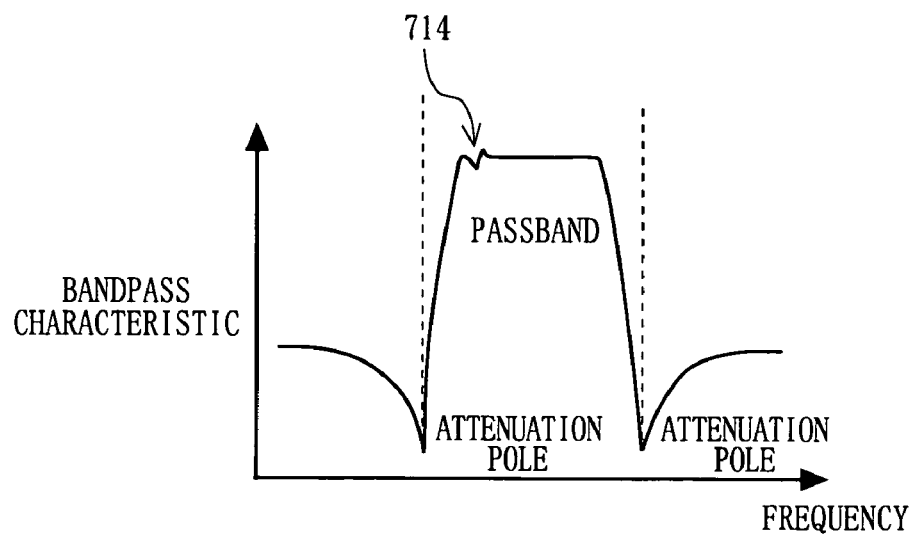
FIG. 15C is a diagram showing a frequency transmittance characteristic when a piezoelectric resonator having a spurious resonant frequency 713 is used for a filter shown in FIG. 15B.

FIG. 13 is an illustration showing an example of a communication device 411 according to the tenth embodiment of the present invention. In FIG. 13, the communication device 411 includes, the antenna duplexer 404 shown in FIG. 12, a transmission amplifier 405, a filter 406, a transmission circuit 407, a reception amplifier 408, a reception circuit 409, and an antenna 410. A transmission signal output from the transmission circuit 407 is input to the antenna duplexer 404 via the filter 406 and the transmission amplifier 405. The transmission signal input to the antenna duplexer 404 is transmitted via the antenna 410. On the other hand, a reception signal received at the antenna 410 is input to the reception circuit 409 via the antenna duplexer 404 and the reception amplifier 408. As such, with the antenna duplexer 404 excellent in characteristic, such as low loss, a small-sized, high-performance communication device can be achieved. Note that the piezoelectric resonator according to the present invention may be used for the filter 406. Also, the communication device is not meant to be restricted to that shown in FIG. 13, but may be arbitrarily designed. Furthermore, portions to which the piezoelectric resonator according to the present invention are not meant to be restricted to a resonator or a filter. The piezoelectric resonator according to the present invention may be used for a filter at a reception side.

As such, by applying the piezoelectric resonator according to the present invention to an antenna duplexer or a communication device, an antenna duplexer or a communication device having an excellent characteristic can be achieved.

In the piezoelectric resonator, the method of manufacturing the piezoelectric resonator, and the filter, the duplexer, and the communication device using the piezoelectric resonator, spurious resonance is suppressed, thereby improving the characteristic. Therefore, they are useful for cellular phones, wireless communications, wireless Internet connection, and the like.

While the invention has been described in detail, the foregoing description is in all aspects illustrative and not restrictive. It is understood that numerous other modifications and variations can be devised without departing from the scope of the invention.

What is claimed is:

1. A piezoeletric resonator, comprising:
   a substrate;
   a lower electrode formed on or above the substrate;
   a piezoeletric body formed on or above the lower electrode;
   an upper electrode formed on or above the piezoeletric body; and
   a cavity under a vibrating portion formed by the lower electrode, the piezoeletric body, and the upper electrode, the cavity having a trapezoidal shape in section, wherein
   where a resonant frequency of vibration with a thickness of the vibrating portion being a half of a wavelength is taken as fr,
   an average of ultrasonic velocity in a material forming the cavity is taken as Vc, and
   a value determined based on the resonant frequency fr and the average of ultrasonic velocity Vc is taken as $\lambda c$ ($=Vc/fr$),
   a depth of the cavity is set so as to be equal to or larger than $n \times \lambda c/2 - \lambda c/8$ and equal to or smaller than $n \times \lambda c/2 + \lambda c/8$, where n is an integer.

2. The piezoelectric resonator according to claim 1, wherein the depth of the cavity is set as $n \times \lambda c/2$.

3. The piezoelectric resonator according to claim 1, wherein when the piezoeletric resonator is used to form a band-pass filter,
   the depth of the cavity is determined so that no spurious resonant frequency is present within a frequency range of a half of a desired pass-bandwidth of the band-pass filter.

4. The piezoelectric resonator according to claim 3, wherein when the band-pass filter is used for Personal Communications Services (PCS),
   the depth of the cavity is set so as to be equal to or larger than $n \times \lambda c/2 - \lambda c/10$ and equal to or smaller than $n \times \lambda c/2 + \lambda c/10$.

5. A filter including a plurality of piezoelectric resonators, wherein
   at least one of the piezoelectric resonators includes:
   a substrate;
   a lower electrode formed on or above the substrate;
   a piezoeletric body formed on or above the lower electrode;
   an upper electrode formed on or above the piezoeletric body; and
   a cavity under a vibrating portion formed by the lower electrode, the piezoeletric body, and the upper electrode, the cavity having a trapezoidal shape in section and
   where a resonant frequency of vibration with a thickness of the vibrating portion being a half of a wavelength is taken as fr,
   an average of ultrasonic velocity in a material forming the cavity is taken as Vc, and
   a value determined based on the resonant frequency fr and the average of ultrasonic velocity Vc is taken as $\lambda c$ ($=Vc/fr$),
   a depth of the cavity is set so as to be equal to or larger than $n \times \lambda c/2 - \lambda c/8$ and equal to or smaller than $n \times \lambda c/2 + \lambda c/8$, where n is an integer.

6. A duplexer formed by a filter including a plurality of piezoeletric resonators, wherein at least one of the piezoeletric resonators includes:
- a substrate;
- a lower electrode formed on or above the substrate;
- a piezoeletric body formed on or above the lower electrode;
- an upper electrode formed on or above the piezoeletric body; and
- a cavity under a vibrating portion formed by the lower electrode, the piezoeletric body, and the upper electrode, the cavity has a trapezoidal shape in section and where a resonant frequency of vibration with a thickness of the vibrating portion being a half of a wavelength is taken as fr, an average of ultrasonic velocity in a material forming the cavity is taken as Vc, and a value determined based on the resonant frequency fr and the average of ultrasonic velocity Vc is taken as $\lambda c$ (=Vc/fr), a depth of the cavity is set so as to be equal to or larger than $n \times \lambda c/2 - \lambda c/8$ and equal to or smaller than $n \times \lambda c/2 + \lambda c/8$, where n is an integer.

7. A communication device including a piezoeletric resonator, wherein the piezoeletric resonator includes:
- a substrate;
- a lower electrode formed on or above the substrate;
- a piezoeletric body formed on or above the lower electrode;
- an upper electrode formed on or above the piezoeletric body; and
- a cavity under a vibrating portion formed by the lower electrode, the piezoeletric body, and the upper electrode, the cavity has a trapezoidal shape in section and where a resonant frequency of vibration with a thickness of the vibrating portion being a half of a wavelength is taken as fr, an average of ultrasonic velocity in a material forming the cavity is taken as Vc, and a value determined based on the resonant frequency fr and the average of ultrasonic velocity Vc is taken as $\lambda c$ (=Vc/fr), a depth of the cavity is set so as to be equal to or larger than $n \times \lambda c/2 - \lambda c/8$ and equal to or smaller than $n \times \lambda c/2 + \lambda c/8$, where n is an integer.

* * * * *